US012526989B2

(12) United States Patent
Meotto et al.

(10) Patent No.: US 12,526,989 B2
(45) Date of Patent: Jan. 13, 2026

(54) MICROELECTRONIC DEVICES, MEMORY DEVICES, AND ELECTRONIC SYSTEMS, AND METHODS OF FORMING THE SAME

(71) Applicant: Micron Technology, Inc., Boise, ID (US)

(72) Inventors: Umberto Maria Meotto, Dietlikon (CH); Anna Maria Conti, Milan (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 587 days.

(21) Appl. No.: 17/819,575

(22) Filed: Aug. 12, 2022

(65) Prior Publication Data

US 2024/0057328 A1   Feb. 15, 2024

(51) Int. Cl.
| | |
|---|---|
| *H10B 41/35* | (2023.01) |
| *H10B 41/20* | (2023.01) |
| *H10B 43/10* | (2023.01) |
| *H10B 43/27* | (2023.01) |
| *H10D 62/10* | (2025.01) |

(52) U.S. Cl.
CPC ............ *H10B 41/35* (2023.02); *H10B 41/20* (2023.02); *H10B 43/27* (2023.02); *H10B 43/10* (2023.02); *H10D 62/115* (2025.01)

(58) Field of Classification Search
CPC ........ H10B 41/35; H10B 41/20; H10B 43/27; H10B 43/10; H10B 43/50; H10B 41/41; H10B 43/20; H10B 43/35; H10B 43/40; G11C 5/00
See application file for complete search history.

(56) References Cited

U.S. PATENT DOCUMENTS

| | | | |
|---|---|---|---|
| 8,546,239 B2 | 10/2013 | Harari et al. | |
| 9,397,043 B1* | 7/2016 | Minemura | ............. H10B 43/10 |
| 9,401,371 B1 | 7/2016 | Lee et al. | |
| 9,449,984 B2 | 9/2016 | Alsmeier et al. | |
| 9,960,045 B1 | 5/2018 | Purayath et al. | |
| 10,256,247 B1 | 4/2019 | Kanakamedala et al. | |
| 10,290,648 B1 | 5/2019 | Zhou et al. | |
| 10,734,396 B2 | 8/2020 | Kang | |
| 11,094,627 B2 | 8/2021 | Machkaoutsan et al. | |
| 11,101,210 B2 | 8/2021 | Hu et al. | |

(Continued)

OTHER PUBLICATIONS

Chandolu et al., Microelectronic Devices With Support Pillars Spaced Along a Slit Region Between Pillar Array Blocks, and Related Methods and Systems, U.S. Appl. No. 17/063,101, filed Oct. 5, 2020, 65 pages.

(Continued)

*Primary Examiner* — Galina G Yushina
(74) *Attorney, Agent, or Firm* — TraskBritt

(57) ABSTRACT

A microelectronic device includes a stack structure including tiers each including insulative material and conductive material vertically adjacent the insulative material. The stack structure divided into at least two blocks separated from one another. The microelectronic device further includes at least one slot structure horizontally interposed between the at least two blocks of the stack structure. The at least one slot structure including additional insulative material and at least one contact structure extending through the additional insulative material to source tier underlying the stack structure.

23 Claims, 13 Drawing Sheets

(56) References Cited

U.S. PATENT DOCUMENTS

| | | |
|---|---|---|
| 2013/0009236 A1 | 1/2013 | Lee et al. |
| 2015/0340377 A1 | 11/2015 | Lee |
| 2016/0268283 A1 | 9/2016 | Kitamura et al. |
| 2017/0047334 A1* | 2/2017 | Lu .................. H10B 41/27 |
| 2017/0148805 A1 | 5/2017 | Nishikawa et al. |
| 2017/0256551 A1* | 9/2017 | Lee .................. H10B 41/40 |
| 2020/0168547 A1* | 5/2020 | Lim .................. H10B 43/10 |
| 2020/0194373 A1 | 6/2020 | Baek et al. |
| 2020/0295031 A1 | 9/2020 | Lue |
| 2020/0312416 A1 | 10/2020 | Harari |
| 2020/0312863 A1 | 10/2020 | Iwai et al. |
| 2020/0335509 A1* | 10/2020 | Yang ................ H10B 43/10 |
| 2021/0005629 A1* | 1/2021 | Lim .................. G11C 7/18 |
| 2021/0050361 A1 | 2/2021 | Hopkins et al. |
| 2021/0118899 A1 | 4/2021 | King |
| 2021/0193574 A1* | 6/2021 | Sun ................... H01L 21/311 |
| 2021/0249433 A1 | 8/2021 | Shamanna et al. |
| 2022/0052070 A1* | 2/2022 | Han .................. H10B 41/27 |
| 2022/0059559 A1* | 2/2022 | Meotto .............. H10B 43/40 |

OTHER PUBLICATIONS

Clampitt et al., Electronic Devices Including Support Pillars in Slot Regions, and Related Memory Devices, Systems, and Methods, U.S. Appl. No. 17/668,304, filed Feb. 9, 2022, 75 pages.

* cited by examiner

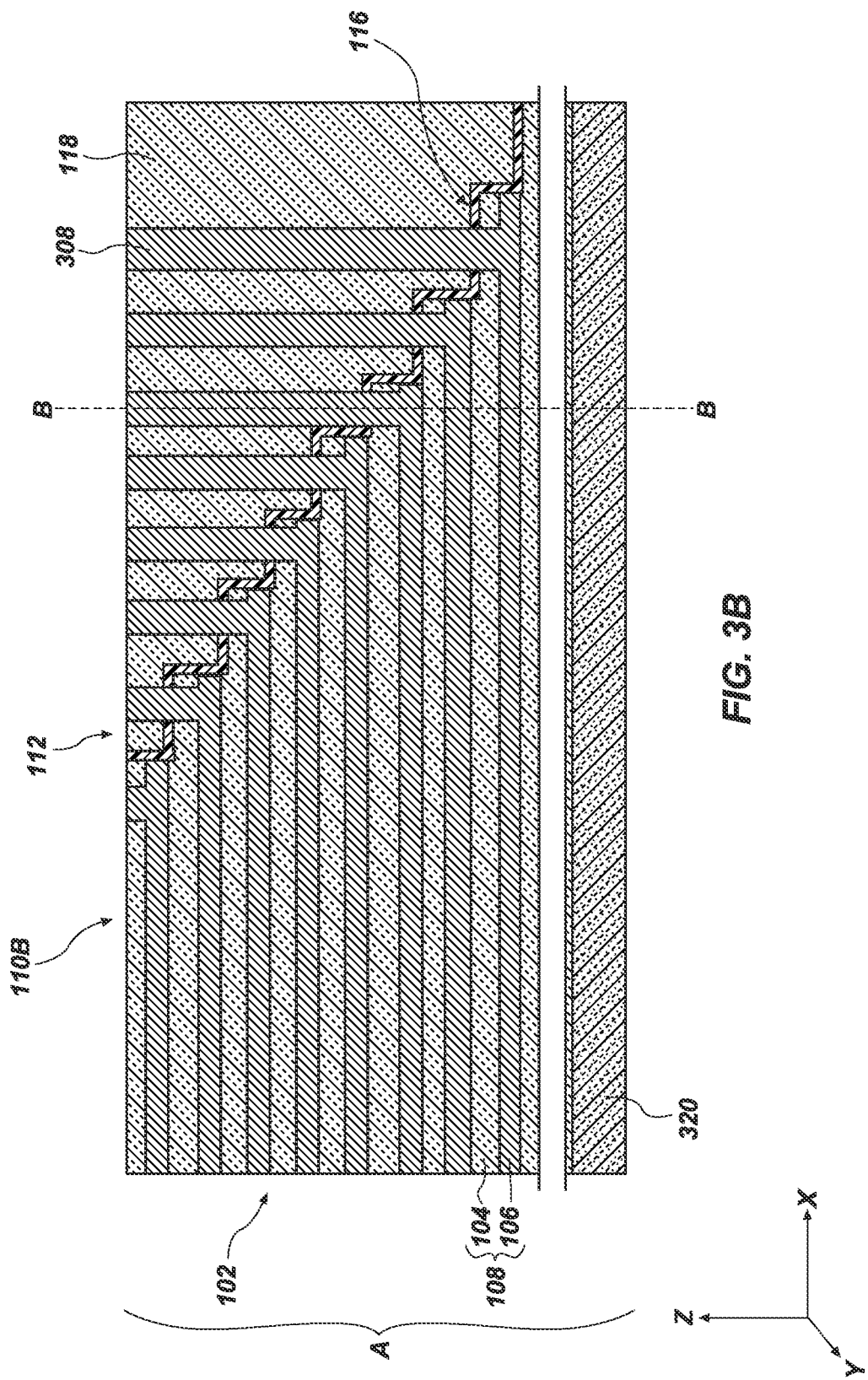

MICROELECTRONIC DEVICES, MEMORY DEVICES, AND ELECTRONIC SYSTEMS, AND METHODS OF FORMING THE SAME

TECHNICAL FIELD

The disclosure, in various embodiments, relates generally to the field of microelectronic device design and fabrication. More specifically, the disclosure relates to microelectronic devices, memory devices, and electronic systems and methods of forming the same.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory (NVM) devices, such as flash memory devices (e.g., NAND flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including structures of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

FIG. 3B is a simplified, longitudinal cross-sectional view of the portion I of the microelectronic device structure shown in FIG. 3A taken along a line A-A;

DETAILED DESCRIPTION

Figure 1:
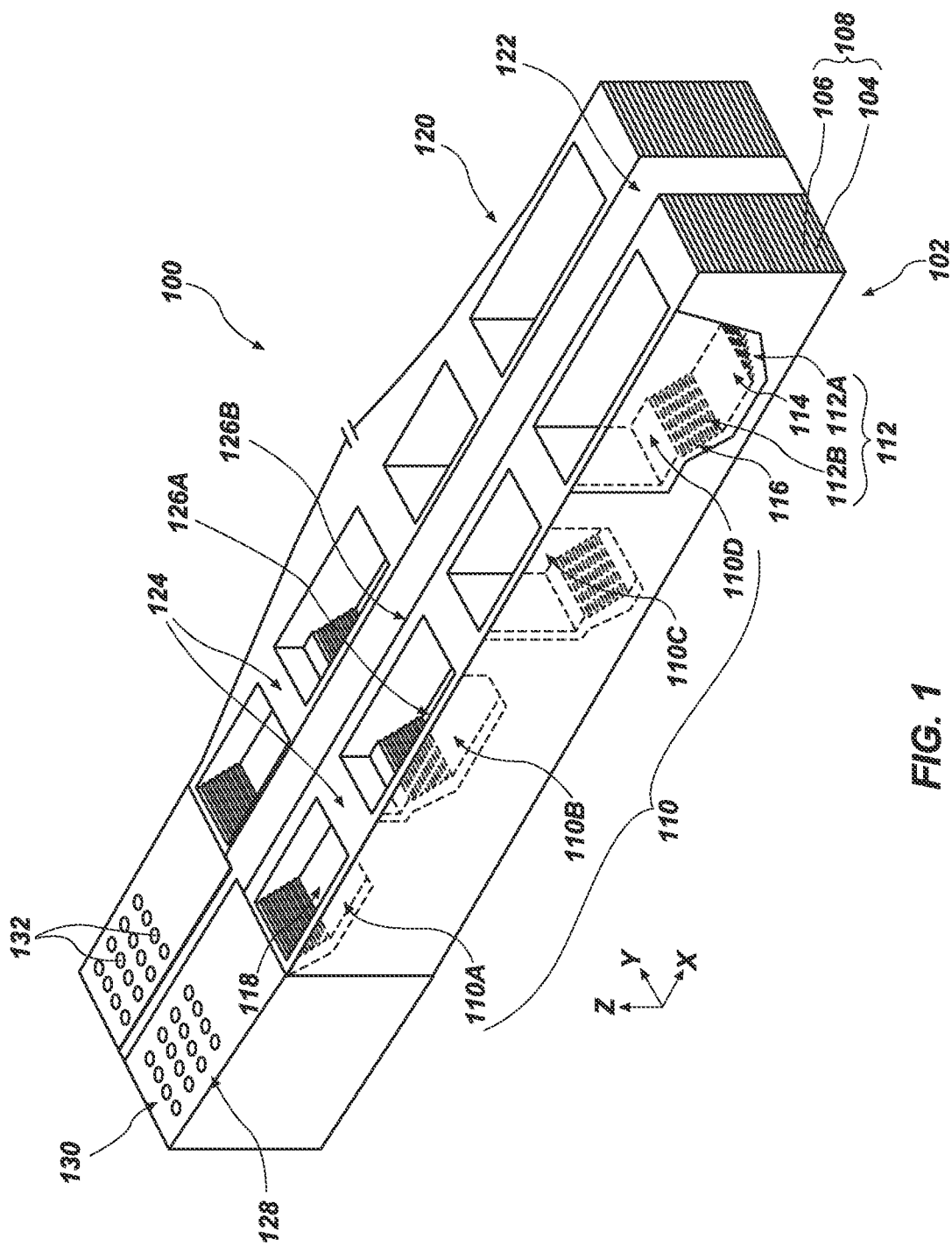
FIG. 1 is a simplified, partial perspective view of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality but not necessarily limited to memory functionality. Stated another way, and by way of non-limiting example only, the term "memory device" includes not only conventional memory (e.g., conventional non-volatile memory; conventional volatile memory) but also includes an application specific integrated circuit (ASIC) (e.g., a system on a chip (SoC)), a microelectronic device combining logic and memory, and a graphics processing unit (GPU) incorporating memory.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_{-x-}$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_xH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_{-x}$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 illustrates a simplified, partial perspective view of a microelectronic device structure 100 of a microelectronic device (e.g., a memory device, such as a 3D NAND Flash memory device). As shown in FIG. 1, the microelectronic device structure 100 may be formed to include a stack structure 102 including a vertically alternating (e.g., in a Z-direction) sequence of insulative structures 104 and conductive structures 106 arranged in tiers 108. Each of the tiers 108 of the stack structure 102 may individually include at least one of the conductive structures 106 vertically neighboring (e.g., directly vertically adjacent) at least one of the insulative structures 104.

The insulative structure 104 of each of the tiers 108 of the stack structure 102 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x}$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative structure 104 of each of the tiers 108 of the stack structure 102 is formed of and includes a dielectric oxide material, such as $SiO_x$ (e.g., $SiO_2$). The insulative structure 104 of each of the tiers 108 may be substantially homogeneous, or the insulative structure 104 of one or more (e.g., each) of the tiers 108 may be heterogeneous.

The conductive structures 106 may formed of and include conductive material, such as one or more of at least one metal, at least one alloy, and at least one conductive metal-containing material (e.g., at least one conductive metal nitride, at least one conductive metal silicide, at least one conductive metal carbide, at least one conductive metal oxide), and least one conductively doped semiconductor material (e.g., conductively doped polysilicon). In some embodiments, the conductive structures 106 are formed of and include tungsten (W). Optionally, at least one liner material (e.g., at least one insulative liner material, at least one conductive liner materials) may be formed around the conductive structures 106. The liner material may, for example, be formed of and include one or more a metal (e.g., Ti, Ta), an alloy, a metal nitride (e.g., $TiN_y$, $TaN_y$), and a metal oxide (e.g., $AlO_x$). In some embodiments, the liner material comprises at least one conductive material employed as a seed material for the formation of the conductive structures 106. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the blocks 120 of the stack structure 102, $AlO_x$ (e.g., $Al_2O_3$) may be formed directly adjacent the insulative structures 104, $TiN_x$ (e.g., TiN) may be formed directly adjacent the $AlO_x$, and W may be formed directly adjacent the $TiN_x$. For clarity and ease of understanding the description, the liner material is not illustrated, but it will be understood that the liner material may be disposed around the conductive structures 106. The conductive structure 106 of each of the tiers 108 of the stack structure 102 may be formed through a so-called "replacement gate" process wherein sacrificial material (e.g., dielectric nitride, such as $SiN_y$) of a preliminary stack structure is selectively removed (e.g., using a wet etchant comprising phosphoric acid ($H_3PO_4$)) relative to insulative material of the insulative structures 104, and then the resulting voids are filled with conductive material to form the conductive structures 106.

The stack structure 102 may be formed to include any desired number of the tiers 108. By way of non-limiting example, the stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Referring still to FIG. 1, the stack structure 102 may be partitioned (e.g., divided, segmented) and divided into blocks 120 separated from one another by slot structures 122. The slot structures 122 may vertically extend (e.g., in the Z-direction) completely through the stack structure 102. As shown in FIG. 1, the blocks 120 of the stack structure 102 may be formed to horizontally extend parallel in an X-direction. As used herein, the term "parallel" means substantially parallel. Horizontally neighboring blocks 120 of the stack structure 102 may be separated from one another in a Y-direction orthogonal to the X-direction by the slot structures 122. The slot structures 122 may also horizontally extend parallel in the X-direction. Each of the blocks 120 of the stack structure 102 may exhibit substantially the same geometric configuration (e.g., substantially the same dimensions and substantially the same shape) as each other of the blocks 120, or one or more of the blocks 120 may exhibit a different geometric configuration (e.g., one or more different dimensions and/or a different shape) than one or more other of the blocks 120. In addition, each pair of horizontally neighboring blocks 120 of the stack structure 102 may be horizontally separated from one another by substantially the same distance (e.g., corresponding to a width in the Y-direction of each of the slot structures 122) as each other pair of horizontally neighboring blocks 120 of the stack structure 102, or at least one pair of horizontally neighboring blocks 120 of the stack structure 102 may be horizontally separated from one another by a different distance than that separating at least one other pair of horizontally neighboring blocks 120 of the stack structure 102. In some embodiments, the blocks 120 of the stack structure 102 are substantially uniformly (e.g., substantially non-variably, substantially equally, substantially consistently) sized, shaped, and spaced relative to one another.

The slot structures 122 may be substantially filled with an insulative material. The insulative material may include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_{-x-}$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, a dielectric oxide material, such as $SiO_x$ (e.g., $SiO_2$) may substantially fill the slot structure 122.

Within each block 120 of the stack structure 102, one or more conductive structures 106 of one or more relatively vertically higher tiers 108 (e.g., upper tiers) may be employed to form upper select gate structures (e.g., drain side select gate (SGD) structures) for upper select transistors (e.g., drain side select transistors) of the block 120. The conductive structures 106 of the relatively vertically higher tiers 108 may be segmented by one or more filled slot(s) (e.g., filled SGD slot(s)) to form the upper select gate structures of the block 120. In some embodiments, within each block 120 of the stack structure 102, the conductive structures 106 of each of less than or equal to eight (8) relatively higher tiers 108 (e.g., from one (1) relatively vertically higher tier 108 to eight (8) relatively vertically higher tiers 108) of the stack structure 102 is employed to form upper select gate structures (e.g., SGD structures) for the block 120. In addition, within each block 120 of the stack structure 102, the conductive structures 106 of at least some relatively vertically lower tiers 108 vertically underlying the relatively vertically higher tiers 108 may be employed to form access line structures (e.g., word line structures) of the block 120. Moreover, within each block 120 of the stack structure 102, the conductive structures 106 of at least a vertically lowest tier 108 may be employed to form as at least one lower select gate structure (e.g., at least one source side select gate (SGS) structure) for lower select transistors (e.g., source side select transistors) of the block 120.

As shown in FIG. 1, the stack structure 102 may include stadium structures 110 formed therein. The stadium structures 110 may be distributed throughout the stack structure 102. As shown in FIG. 1, the stack structure 102 may include rows of the stadium structures 110 extending in parallel in an X-direction, and columns of the stadium structures 110 extending in a Y-direction orthogonal to the X-direction. The rows of the stadium structures 110 may individually include some of the stadium structures 110 at least partially (e.g., substantially) aligned with one another in the Y-direction. The columns of the of the stadium structures 110 may individually include other of the stadium structures 110 at least partially (e.g., substantially) aligned with one another in the X-direction. Different rows of the stadium structures 110 may be positioned within horizontal areas of different blocks 120 of the stack structure 102, as described in further detail below. In additional, the columns of the of the stadium structures 110 may individually include stadium structures 110 within different blocks 120 of the stack structure 102 than one another. In FIG. 1, for clarity and ease of understanding the drawings and associated description, portions of the stack structure 102 are depicted as transparent to more clearly show some of the stadium structures 110 distributed within the stack structure 102.

Still referring to FIG. 1, at least some (e.g., each) of the stadium structures 110 within an individual row of the stadium structures 110 within an individual block 120 may be positioned at different vertical elevations in the Z-direction than one another. For example, as depicted in FIG. 1, an individual row of the stadium structures 110 may include a first stadium structure 110A, a second stadium structure 110B at a relatively lower vertical position (e.g., in the Z-direction) within the stack structure 102 than the first stadium structure 110A, a third stadium structure 110C at a relatively lower vertical position within the stack structure 102 than the second stadium structure 110B, and a fourth stadium structure 110D at a relatively lower vertical position within the block 120 than the third stadium structure 110C. In addition, within an individual row of the stadium structures 110, horizontally neighboring (e.g., in the X-direction) stadium structures 110 may be substantially uniformly (e.g., equally, evenly) horizontally spaced apart from one another. In additional embodiments, one or more rows of the stadium structures 110 may individually include a different quantity of stadium structures 110 and/or a different distribution of stadium structures 110 than that depicted in FIG. 1. For example, an individual row of the stadium structures 110 may include greater than four (4) of the stadium structures 110 (e.g., greater than or equal to five (5) of the stadium structures 110, greater than or equal to ten (10) of the stadium structures 110, greater than or equal to twenty-five (25) of the stadium structures 110, greater than or equal to fifty (50) of stadium structures 110), or less than four (4) of the stadium structures 110 (e.g., less than or equal to three (3) of the stadium structures 110, less than or equal to two (2) of the stadium structures 110, only one (1) of the stadium structures 110). As another example, within an individual row of the stadium structures 110, at least some horizontally neighboring stadium structures 110 may be at least partially non-uniformly (e.g., non-equally, non-evenly) horizontally spaced, such that at least one of the stadium structures 110 of the row is separated from at least two other of the stadium structures 110 of the row horizontally neighboring the at least one stadium structures 110 by different (e.g., non-equal) distances. As an additional non-limiting example, within an individual row of the stadium structures 110, vertical positions (e.g., in the Z-direction) of the stadium structures 110 may vary in a different manner (e.g., may alternate between relatively deeper and relatively shallower vertical positions) than that depicted in FIG. 1.

Each stadium structure 110 may include opposing staircase structures 112, and a central region 114 horizontally interposed between (e.g., in the X-direction) the opposing staircase structures 112. The opposing staircase structures 112 of each stadium structure 110 may include a forward staircase structure 112A and a reverse staircase structure 112B. A phantom line extending from a top of the forward staircase structure 112A to a bottom of the forward staircase structure 112A may have a positive slope, and another phantom line extending from a top of the reverse staircase structure 112B to a bottom of the reverse staircase structure 112B may have a negative slope. In additional embodiments, one or more of the stadium structures 110 may individually exhibit a different configuration than that depicted in FIG. 1. As a non-limiting example, at least one stadium structure 110 may be modified to include a forward staircase structure 112A but not a reverse staircase structure 112B (e.g., the reverse staircase structure 112B may be absent), or at least one stadium structure 110 may be modified to include a reverse staircase structure 112B but not a forward staircase structure 112A (e.g., the forward staircase structure 112A may be absent). In such embodiments, the central region 114 horizontally neighbors a bottom of the forward staircase structure 112A (e.g., if the reverse staircase structure 112B is absent), or the central region 114 horizontally neighbors a bottom of the reverse staircase structure 112B (e.g., if the forward staircase structure 112A is absent).

The opposing staircase structures 112 (e.g., the forward staircase structure 112A and the reverse staircase structure 112B) of an individual stadium structure 110 each include steps 116 defined by edges (e.g., horizontal ends) of the tiers 108 of the stack structure 102. For the opposing staircase structures 112 of an individual stadium structure 110, each step 116 of the forward staircase structure 112A may have a counterpart step 116 within the reverse staircase structure 112B having substantially the same geometric configuration (e.g., shape, dimensions), vertical position (e.g., in the Z-direction), and horizontal distance (e.g., in the X-direction) from a horizontal center (e.g., in the X-direction) of the central region 114 of the stadium structure 110. In additional embodiments, at least one step 116 of the forward staircase structure 112A does not have a counterpart step 116 within the reverse staircase structure 112B having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110; and/or at least one step 116 of the reverse staircase structure 112B does not have a counterpart step 116 within the forward staircase structure 112A having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110. In additional embodiments, one or more of the stadium structures 110 only includes a single (e.g., only one) staircase structure 112, rather than opposing staircase structures 112. The stadium structure(s) 110 may be considered a monodirectional staircase structure and may include a forward staircase structure 112A but not a reverse staircase structure 112B, or vice versa.

Each of the stadium structures 110 of the stack structure 102 may individually include a desired quantity of steps 116. Each of the stadium structures 110 may include substantially the same quantity of steps 116 as each other of the stadium structures 110, or at least one of the stadium structures 110 may include a different quantity of steps 116 than at least one other of the stadium structures 110. In some embodiments, at least one of the stadium structures 110 includes a different (e.g., greater, lower) quantity of steps 116 than at least one other of the stadium structures 110. As shown in FIG. 1, in some embodiments, the steps 116 of each of the stadium structures 110 are arranged in order, such that steps 116 directly horizontally adjacent (e.g., in the X-direction) one another correspond to tiers 108 of the stack structure 102 directly vertically adjacent (e.g., in the Z-direction) one another. In additional embodiments, the steps 116 of at least one of the stadium structures 110 are arranged out of order, such that at least some steps 116 of the stadium structure 110 directly horizontally adjacent (e.g., in the X-direction) one another correspond to tiers 108 of stack structure 102 not directly vertically adjacent (e.g., in the Z-direction) one another.

With continued reference to FIG. 1, for an individual stadium structure 110, the central region 114 thereof may horizontally intervene (e.g., in the X-direction) between and separate the forward staircase structure 112A thereof from the reverse staircase structure 112B thereof. The central region 114 may horizontally neighbor a vertically lowermost step 116 of the forward staircase structure 112A and may also horizontally neighbor a vertically lowermost step 116 of the reverse staircase structure 112B. The central region 114 of an individual stadium structure 110 may have desired horizontal dimensions. In addition, the central region 114 of each of the stadium structures 110 may have substantially the same horizontal dimensions as the central region 114 of each other of the stadium structures 110, or the central region 114 of at least one of the stadium structures 110 may have different horizontal dimensions than the central region 114 of at least one other of the stadium structures 110.

Still referring to FIG. 1, each stadium structure 110 (including the forward staircase structure 112A, the reverse staircase structure 112B, and the central region 114 thereof) within the stack structure 102 may individually partially define boundaries (e.g., horizontal boundaries, vertical boundaries) of a trench 118 vertically extending (e.g., in the Z-direction) through the stack structure 102. The portions of the stack structure 102 horizontally neighboring an individual stadium structure 110 may also partially define the boundaries of the trench 118 associated with the stadium structure 110. The trench 118 may vertically extend through tiers 108 of the stack structure 102 defining the forward staircase structure 112A and the reverse staircase structure 112B of the stadium structure 110; or may also vertically extend through additional tiers 108 of the stack structure 102 not defining the forward staircase structure 112A and the reverse staircase structure 112B of the stadium structure 110, such as additional tiers 108 of the stack structure 102 vertically overlying the stadium structure 110. Edges of the additional tiers 108 of the stack structure 102 may, for example, define one or more additional stadium structures vertically overlying and horizontally offset from the stadium structure 110. The trench 118 may be filled with one or more dielectric materials, as described in further detail below.

With continued reference to FIG. 1, each block 120 of the stack structure 102 may include a row of the stadium structures 110 (e.g., including the first stadium structure 110A, the second stadium structure 110B, the third stadium structure 110C, and the fourth stadium structure 110D of the row), crest regions 124 (e.g., elevated regions), and bridge regions 126 (e.g., additional elevated regions). The crest regions 124 may be horizontally interposed between stadium structures 110 horizontally neighboring one another in the X-direction. The bridge regions 126 may horizontally neighbor opposing sides of individual stadium structures 110 in the Y-direction and may horizontally extend from and between crest regions 124 horizontally neighboring one another in the X-direction. In additional embodiments, one or more (e.g., each) of the blocks 120 of the stack structure 102 is free of bridge regions 126 horizontally neighboring one or more of the stadium structures 110 thereof in the Y-direction. The stadium structures 110 may, for example, horizontally extend in the Y-direction to the boundaries of the slot structures 122. Put another way, the bridge regions 126 may not be horizontally interposed, in the Y-direction, between the stadium structures 110 and the slot structure 122. In further embodiments, one or more (e.g., each) of the blocks 120 of the stack structure 102 is free of one or more crest regions 124 horizontally neighboring, in the X-direction, one or more of the stadium structures 110 thereof.

The crest regions 124 of an individual block 120 of the stack structure 102 may intervene between and separate stadium structures 110 horizontally neighboring one another in the X-direction. For example, one of the crest regions 124 may intervene between and separate the first stadium structure 110A and the second stadium structure 110B; an additional one of the crest regions 124 may intervene between and separate the second stadium structure 110B and the third stadium structure 110C; and a further one of the crest regions 124 may intervene between and separate the third stadium structure 110C and the fourth stadium structure 110D. A vertical height of the crest regions 124 in the Z-direction may be substantially equal to a maximum vertical height of the block 120 in the Z-direction; and a horizontal width of the crest regions 124 in the Y-direction may be substantially equal to a maximum horizontal width of the block 120 in the Y-direction. In addition, each of the crest regions 124 may individually exhibit a desired horizontal length in the X-direction. Each of the crest regions 124 of an individual block 120 of the stack structure 102 may exhibit substantially the same horizontal length in the X-direction as each other of the crest regions 124 of the block 120; or at least one of the crest regions 124 of the block 120 may exhibit a different horizontal length in the X-direction than at least one other of the crest regions 124 of the block 120.

The bridge regions 126 of an individual block 120 of the stack structure 102 may be formed to intervene between and separate the stadium structures 110 of the block 120 from the slot structures 122 horizontally neighboring the block 120 in the Y-direction. For example, for each stadium structure 110 within an individual block 120 of the stack structure 102, a first bridge region 126A may be horizontally interposed in the Y-direction between a first side of the stadium structure 110 and a first of the slot structures 122 horizontally neighboring the block 120; and a second bridge region 126B may be horizontally interposed in the Y-direction between a second side of the stadium structure 110 and a second of the slot structures 122 horizontally neighboring the block 120. The first bridge region 126A and the second bridge region 126B may horizontally extend in parallel in the X-direction. In addition, the first bridge region 126A and the second bridge region 126B and may each horizontally extend from and between crest regions 124 of the block 120 horizontally neighboring one another in the X-direction. The bridge regions 126 of the block 120 may be integral and continuous with the crest regions 124 of the block 120. Upper boundaries (e.g., upper surfaces) of the bridge regions 126 may be substantially coplanar with upper boundaries of the crest regions 124. A vertical height of the bridge regions 126 in the Z-direction may be substantially equal to a maximum vertical height of the block 120 in the Z-direction. In addition, each of the bridge regions 126 (including each first bridge region 126A and each second bridge region 126B) may individually exhibit a desired horizontal width in the Y-direction and a desired horizontal length in the X-direction. Each of the bridge regions 126 of the block 120 may exhibit substantially the same horizontal length in the X-direction as each other of the bridge regions 126 of the block 120; or at least one of the bridge regions 126 of the block 120 may exhibit a different horizontal length in the X-direction than at least one other of the bridge regions 126 of the block 120. In addition, each of the bridge regions 126 of the block 120 may exhibit substantially the same horizontal width in the Y-direction as each other of the bridge regions 126 of the block 120; or at least one of the bridge regions 126 of the block 120 may exhibit a different horizontal width in the Y-direction than at least one other of the bridge regions 126 of the block 120.

Each block 120 of the stack structure 102 may also include an array region 128 horizontally neighboring (e.g., in the X-direction) the first stadium structure 110A thereof. The array region 128 may be separated from the first stadium structure 110A by one of the crest regions 124. The array region 128 may include an array 130 of cell pillar structures 132. The cell pillar structures 132 may vertically extend completely through the tiers 108 of the stack structure 102. The cell pillar structures 132 may each individually be formed of and include a stack of materials. By way of non-limiting example, each of the cell pillar structures 132 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second dielectric oxide material (e.g., $SiO_x$, such as $SiO_2$); a channel material, such as a semiconductor material (e.g., silicon, such as polycrystalline silicon); and a dielectric fill material (e.g., a dielectric oxide, a dielectric nitride, air). The charge-blocking material may be formed on or over surfaces of the conductive structures 106 and the insulative structures 104 of the tiers 108 of stack structure 102 at least partially defining horizontal boundaries of the cell pillar structures 130; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material.

Intersections of the cell pillar structures 132 and the conductive structures 106 of some of the tiers 108 (e.g., access line tiers) form strings of memory cells vertically extending through each block 120 of the stack structure 102. In some embodiments, the memory cells formed at the intersections of the conductive structures 106 of the active access line tiers (e.g., the active access line tier 110A) and the pillar structures 122 comprise so-called "MONOS" (metal-oxide-nitride-oxide-semiconductor) memory cells. In additional embodiments, the memory cells comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 132 and the conductive structures 106 of different tiers 108 of the stack structure 102. In addition, intersections of the cell pillar structures 132 and the conductive structures 106 of some other of the tiers 108 (e.g., select gate tiers) of the stack structure 104 may define different select transistors coupled in series with the strings of memory cells.

Figure 2:
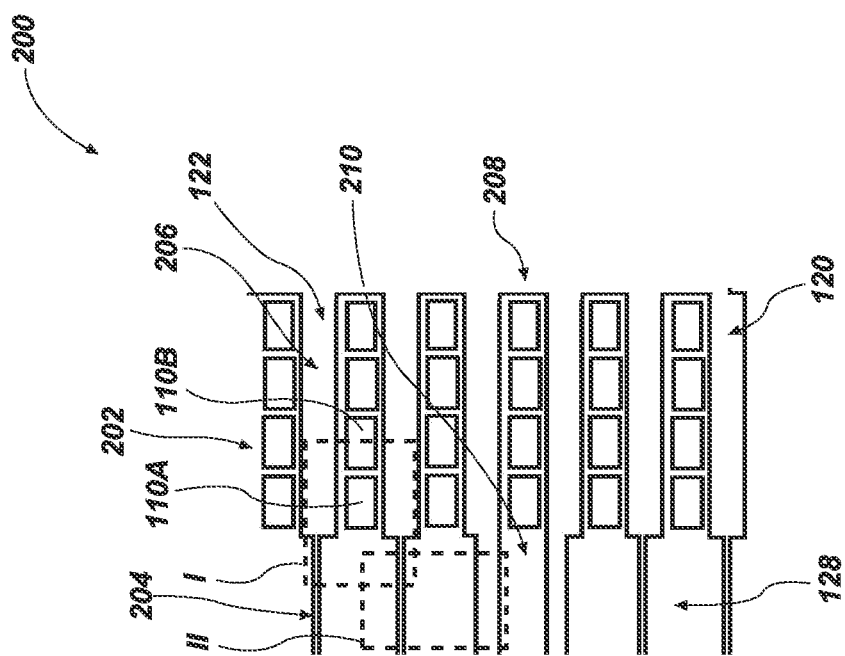
FIG. 2 illustrates a top-down view of a microelectronic device structure, in accordance with an embodiment of the disclosure.

FIG. 2 illustrates a top-down view of a portion of a microelectronic device structure 200, in accordance with embodiments of the disclosure. The configuration of the microelectronic device structure 200 described hereinbelow may be employed in the microelectronic device structure 100 previously described with reference to FIG. 1. Accordingly, some reference numerals previously described with reference to FIG. 1 are also presented in FIG. 2, and are associated with features (e.g., regions, materials, structures, devices) substantially the same as those previously described with reference to FIG. 1. It will also be understood that, even if not identified by a reference numeral in FIG. 2, the microelectronic device structure 200 may include any (e.g., all) of the additional features of the microelectronic device structure 100 previously described with reference to FIG. 1. As shown in FIG. 2, the microelectronic device structure 200 may include multiple (e.g., more than one) blocks 120 individually including an array region 128 and a staircase region 202. Slot structures 122 may be horizontally interposed in the Y-direction between blocks 120 horizontally neighboring one another in the Y-direction. As described above, the array regions 128 of the block 120 may include arrays 130 of cell pillar structures 132. The staircase regions 202 of the block 120 may include multiple horizontally aligned (e.g., in the Y-direction) stadium structures 110, such as the first stadium structure 110A, the second stadium structure 110B, the third stadium structure 110C, and the fourth stadium structure 110D described above. The blocks 120 are separated by slot structures 122. The slot structures 122 may individually include narrow regions 204 (e.g., first regions) and wide regions 206 (e.g., second regions). The narrow region 204 of an individual slot structure 122 may be positioned horizontally proximate the array regions 128 of blocks 120 horizontally neighboring the slot structure 122, and the wide regions 206 of the slot structure 122 may be positioned horizontally proximate the staircase regions 202 of the blocks 120 horizontally neighboring the slot structure 122. The narrow regions 204 of the slot structure 122 may horizontally overlap (e.g., in the X-direction) the array regions 128 of the block 120; and the wide regions 206 of the slot structure 122 may horizontally overlap (e.g., in the X-direction) the staircase regions 202 of the block 120.

At least one of the blocks 120 of the microelectronic device structure 200 may be a so-called "exit" block 208. The exit block 208 may have a different configuration than at least some other of the blocks 120. For example, the array region 128 of the exit block 208 may not include the arrays 130 of cell pillar structures 132, or may include a reduced number of cell pillar structures 132 in each array 130. The array region 128 of the exit block 208 may be configured to serve as a bit line exit region 210, where an external connection may be made to bit lines (e.g., digit lines, data lines) vertically overlying and operatively associated with cell pillar structures 132. Regions of at least one slot structure 122 horizontally neighboring the bit line exit region 210 may have a horizontal width (e.g., in the Y-direction) greater than a horizontal width of the narrow regions 204 of the slot structure 122 in the narrow region 204. In some embodiments, as illustrated in FIG. 2, regions of the slot structures 122 most horizontally proximate to the bit line exit region 210 may individually have a horizontal width less than the horizontal widths of the wide regions 206 of the slot structures 122 most horizontally proximate the staircase region 202. In other embodiments, the horizontal width of regions of the slot structures 122 most horizontally proximate to the bit line exit region 210 are substantially the same as the horizontal widths of the wide regions 206 of the slot structures 122 most horizontally proximate the staircase region 202.

Figure 3A:
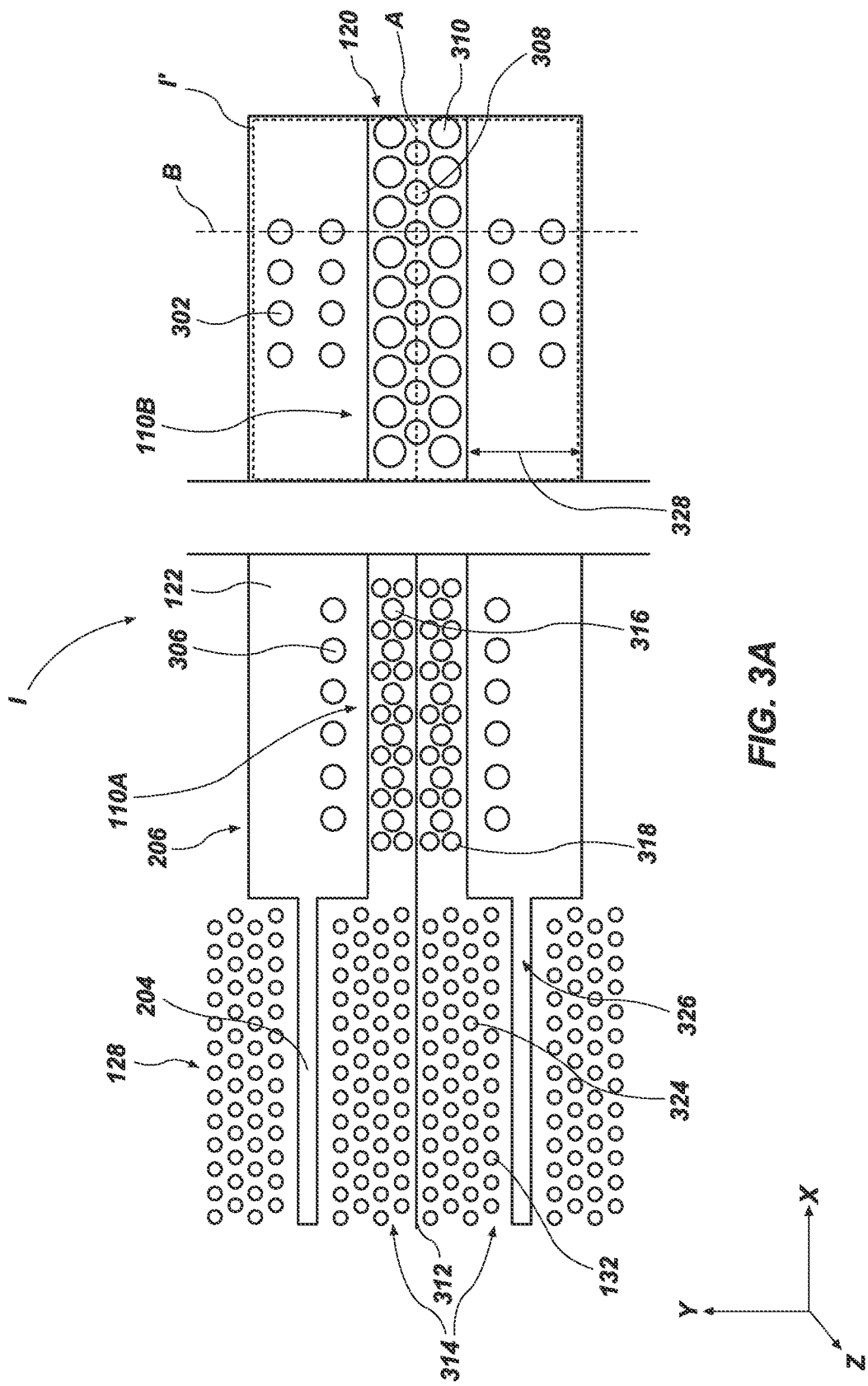
FIG. 3A illustrates an enlarged top-down view of a portion I of the embodiment of the microelectronic device structure illustrated in FIG. 2.
Figure 3C:
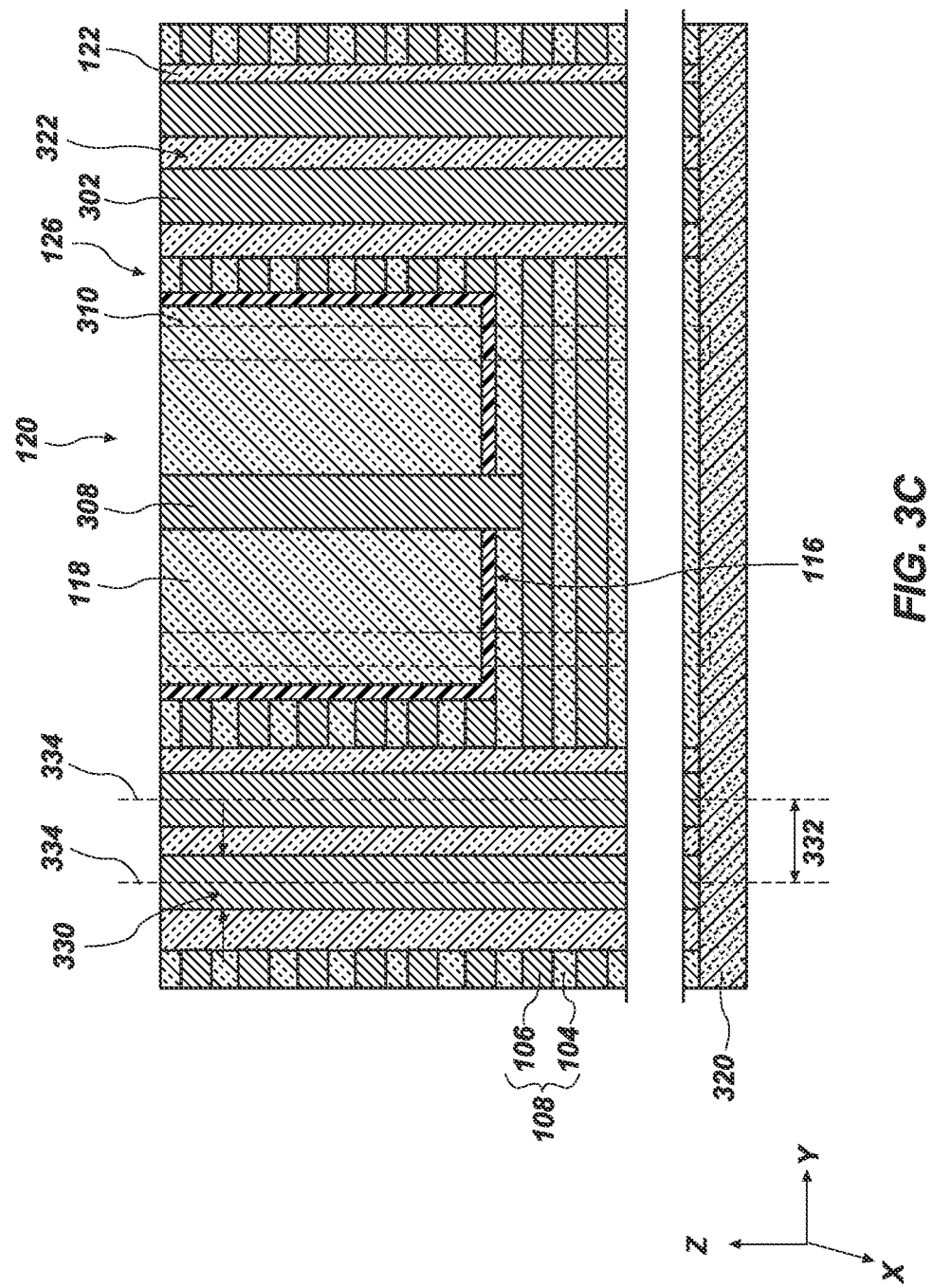
FIG. 3C is a simplified cross-sectional view of the portion I of the microelectronic device structure shown in FIGS. 3A and 3B taken along a line B-B.

FIGS. 3A-3C illustrate different top-down and cross-sectional views within a section I of the microelectronic device structure 200 shown in FIG. 2. FIG. 3A illustrates a top-down view of section I of the microelectronic device structure 200. The section I of FIG. 2 includes a portion of an array region 128, all of a first stadium structure 110A and a portion of a second stadium structure 110B, as well as portions of adjacent slot structures 122 including both a narrow region 204 and a wide region 206. FIG. 3B illustrates a longitudinal cross-section view of the portion of the second stadium structure 110B identified as section i' along a line A shown in FIG. 3A. FIG. 3C illustrates a longitudinal cross-sectional view of the second stadium structure 110B along a line B shown in FIGS. 3A and 3B.

Referring to FIG. 3A, the narrow region 204 of an individual slot structure 122 may have a first width 326 less than about 500 nanometers (nm), such as within a range of from about 100 nm to about 400 nm, or from about 200 nm to about 300 nm. In addition, the wide region 206 of an individual slot structure 122 may have a second width 328 of greater than or equal to about 500 nm, such as within a range of from about 500 nm to about 2 micrometers (μm). The array region 128 may have a third width 324 of an individual block 120 that may be within a range of from about 2 μm to about 4 μm, which may facilitate a relatively large number of cell pillar structures 132 within the array region 128. The stadium structures 110 in the staircase region 202 may have a width that is less than the width 324 of an adjacent array region 128 to provide additional space for the slot structure 122 in the wide region 206.

Referring collectively to FIGS. 1 and 3A, different tiers 108 within each block 120 may have different purposes. For example, relatively vertically higher tiers 108 (e.g., upper tiers), such as those within the first stadium structure 110A, may be employed to form upper select gate structures (e.g., drain side select gate (SGD) structures) for upper select transistors (e.g., drain side select transistors) of the block 120. The relatively vertically higher tiers 108 may be segmented by a filled slot 312 (e.g., a filled SGD slot) to form the upper select gate structures 314 of the block 120. This may result in the relatively vertically higher tiers 108 having a different configuration than the relatively lower tiers 108, such as those in the second stadium structure 110B or even the tiers 108 that are relatively lower in the first stadium structure 110A. The filled slots 312 within a horizontal area of an individual block 120 may horizontally extend into at least a portion of the first stadium structure 110A within the horizontal area of the block 120, such as at least partially into the reverse staircase structure 112B of the first stadium structure 110A.

For an individual block 120, each select gate structure 314 thereof (as defined by the conductive structures 106 (FIG. 1) of vertically higher tiers 108 and the filled slots 312 (FIG. 3A)) may include one or more select gate contact structures 316 in electrical communication therewith. Select gate contact structures 316 may be positioned within a horizontal area the first stadium structure 110A contacting individual steps 116 (FIG. 1) of the first stadium structure 110A. First active contact structures 306 may be positioned within horizontal areas of the wide regions 206 of the slot structures 122 adjacent to the first stadium structure 110A. The first active contact structures 306 formed in the wide region 206 may be substantially surrounded by the insulative fill material within the slot structure 122, such that the first active contact structures 306 within the wide region 206 extend to lower conductive structures without horizontally overlapping the conductive structures 106 of the stack structure 102 (FIG. 1). The first active contact structures 306 may be provided in electrical communication with the select gate contact structures 316 (and, hence, the select gate structures 314) by way of conductive routing structures formed to extend therebetween.

Support contact structures 318 may also be formed in the first stadium structure 110A between the select gate contact structures 316. The support contact structures 318 may extend to the base construction 320 (FIG. 3B) and may be configured to support the tiers 108 of the stack structure 102 during the replace gate process described above. The support contact structures 318 may be formed from an insulative material, which may facilitate the support contact structures 318 having a smaller major dimension than the first active contact structures 306 and select gate contact structures 316.

Conductive structures 106 of relatively lower tiers 108, such as the tiers 108 having horizontal ends at least partially defining the staircase structures 112 of stadium structures 110 vertically underlying the first stadium structure 110A (e.g., the second stadium structure 110B, third stadium structure 110C, and fourth stadium structure 110D), as well as tiers 108 at least partially defining relatively lower steps 116 within the first stadium structure 110A may be employed as access line structures, and are not partitioned by the filled slots 312. Additional contact structures 308 (e.g., access line contact structures) may contact the conductive structures 106 of such relatively lower tiers 108 at the steps 116 of the relatively vertically lower stadium structures 110 of an individual block 120. In addition, within the horizontal areas of the relatively vertically lower stadium structures 110, support contact structures 310 may vertically extend through the tiers 108 to a base construction 320 (FIG. 3B) underlying the blocks 120. The support contact structures 310 may be configured to support the tiers 108 during the replace gate process described above. Second active contact structures 302 may be positioned within the wide regions 206 adjacent to the associated stadium structures 110. The active contact structures may extend to the base construction 320 (FIG. 3B).

In a conventional microelectronic device, active contact structures performing functions similar to those of the second active contact structures 302 may be positioned within horizontal boundaries of the blocks 120 (FIG. 1) of the stack structure 102 (FIG. 1), such as within horizontal areas of the crest regions 124 (FIG. 1). Such positioning of conventional active contact structures requires the formation of an insulative liner material to surround conductive material of the active contact structures to preclude the active contact structures shorting conductive structures 106 of multiple tiers 108 with one another. Forming the insulative liner material requires additional processing, and can be complex to implement for relatively high aspect ratio (HAR) active contact structures. Positioning the second active contact structures 302 within the wide regions 206 may facilitate forming the second active contact structures 302 without an insulative layer surrounding the second active contact structures 302. For example, the wide region 206 may be filled with an insulative material, such that the second active contact structures 302 may be formed through a single fill or deposition process rather than forming an insulative liner material before forming a conductive core. This may result in a reduction in processing time, a reduction in processing complexity, and/or a reduction in microelectronic device defects as compared to conventional processes for forming conventional microelectronic device structures.

Referring next to FIG. 3B, which is a simplified, longitudinal cross-sectional view of the portion i' of the second stadium structure 110B shown in FIGS. 1 and 3A, the are the additional contact structures 308 vertically extend (e.g., in the Z-direction) through the insulative material in the trench 118 and contact (e.g., land on) the conductive structures 106 of the tiers 108 at the steps 116 of the second stadium structure 110B. Each additional contact structure 308 may individually contact (e.g., physically contact, electrically contact) the conductive structure 106 of an individual tier 108 of the stack structure 102 at an individual step 116 of an individual stadium structure 110 of an individual block 120 of the stack structure 102. In some embodiments, the additional contact structures 308 within a horizontal area of an individual stadium structure 110 (FIG. 1) (e.g., the second stadium structure 110B) are substantially horizontally centered (e.g., in the Y-direction, in the X-direction) on the steps 116 of the stadium structure 110. The additional contact structures 308 may at least partially horizontally overlap one another in the Y-direction. As shown in FIG. 3A, in some embodiments, the additional contact structures 308 within a horizontal area of an individual stadium structure 110 (FIG. 1) (e.g., the second stadium structure 110B) are substantially aligned with one another in the Y-direction.

The additional contact structures 308 may be formed of and include conductive material. As a non-limiting example, the additional contact structures 308 may be formed of and include one or more of at least one metal, at least one alloy, and at least one conductive metal-containing material (e.g., a conductive metal nitride, a conductive metal silicide, a conductive metal carbide, a conductive metal oxide). A material composition of the additional contact structures 308 may be substantially the same as a material composition of the conductive structures 106 of the tiers 108 of the blocks 120 of the stack structure 102, or the material composition of the additional contact structures 308 may be different than the material composition of the conductive structures 106 of the tiers 108 of the blocks 120 of the stack structure 102. In some embodiments, the additional contact structures 308 are individually formed of and include tungsten (W). The additional contact structures 308 may individually be homogeneous, or the additional contact structures 308 may individually be heterogeneous.

The additional contact structures 308 may be formed by forming (e.g., non-conformably depositing, such as through one or more of a PVD process and a non-conformal CVD process) conductive material inside and outside of contact openings formed through the insulative material in the trench 118, and then removing (e.g., through an abrasive planarization process, such as a CMP process) portions of the conductive material overlying an uppermost vertical boundary (e.g., an uppermost surface) of the insulative fill material in the trench 118. The insulative fill material in the trench 118 may substantially isolate the additional contact structures 308 from the other conductive structures 106 in the stack structure 102.

Referring next to FIG. 3C, which is a simplified cross-sectional view of the portion I along line B shown in FIG.

3B, the support contact structures 310 may be positioned within the horizontal areas of the stadium structures 110 (FIG. 1) (and, hence, the filled trenches 118) and may horizontally neighbor the additional contact structures 308. The support contact structures 310 may vertically extend through the stack structure 102 and to or into the base construction 320. The support contact structures 310 may be formed of and include one or more of conductive material and insulative material. In some embodiments, the support contact structures 310 individually include a conductive core structure surrounded by an insulative liner structure. In additional embodiments, the support contact structures 310 only include insulative material.

A bridge region 126 may form an outer wall of the filled trench 118 and may also form an outer wall of the block 120 in the staircase region 202 (FIG. 2). In additional embodiments wherein bridge regions 126 are omitted (e.g., absent) from one or more of the blocks 120, the slot structures 122 may define horizontal boundaries in the Y-direction of the filled trenches 118. The blocks 120 may be separated from one another by the slot structures 122. The second active contact structures 302 vertically extend through and may be located within horizontal areas of the slot structures 122. The second active contact structures 302 may formed of and include conductive material, such as one or more of at least one conductively doped semiconductor material, at least one metal, at least one alloy, and at least one conductive metal-containing material (e.g., at least one conductive metal nitride, at least one conductive metal silicide, at least one conductive metal carbide, at least one conductive metal oxide). In some embodiments, the second active contact structures 302 are formed of and include tungsten (W). Insulative fill material 322 of the slot structures 122 may substantially horizontally surround the second active contact structures 302.

The second active contact structures 302 may each have a major cross-sectional dimension 330 (e.g., diameter, apothem, width, etc.) within a range of from about 100 nm to about 600 nm, such as from about 200 nm to about 500 nm. A pitch 332 between the centers 334 of horizontally neighboring second active contact structures 302 may be within a range of from about 500 nm to about 1.5 µm. In some embodiments, second active contact structures 302 horizontally neighboring one another in the X-direction may be laterally aligned with one another in the Y-direction, as illustrated in FIG. 3A. In other embodiments, second active contact structures 302 neighboring one another in the X-direction may be laterally offset from one another in the Y-direction. For example, within a horizontal area of individual slot structures 122, the second active contact structures 302 may be arranged in rows extending in parallel with one another in the X-direction.

Figure 4:
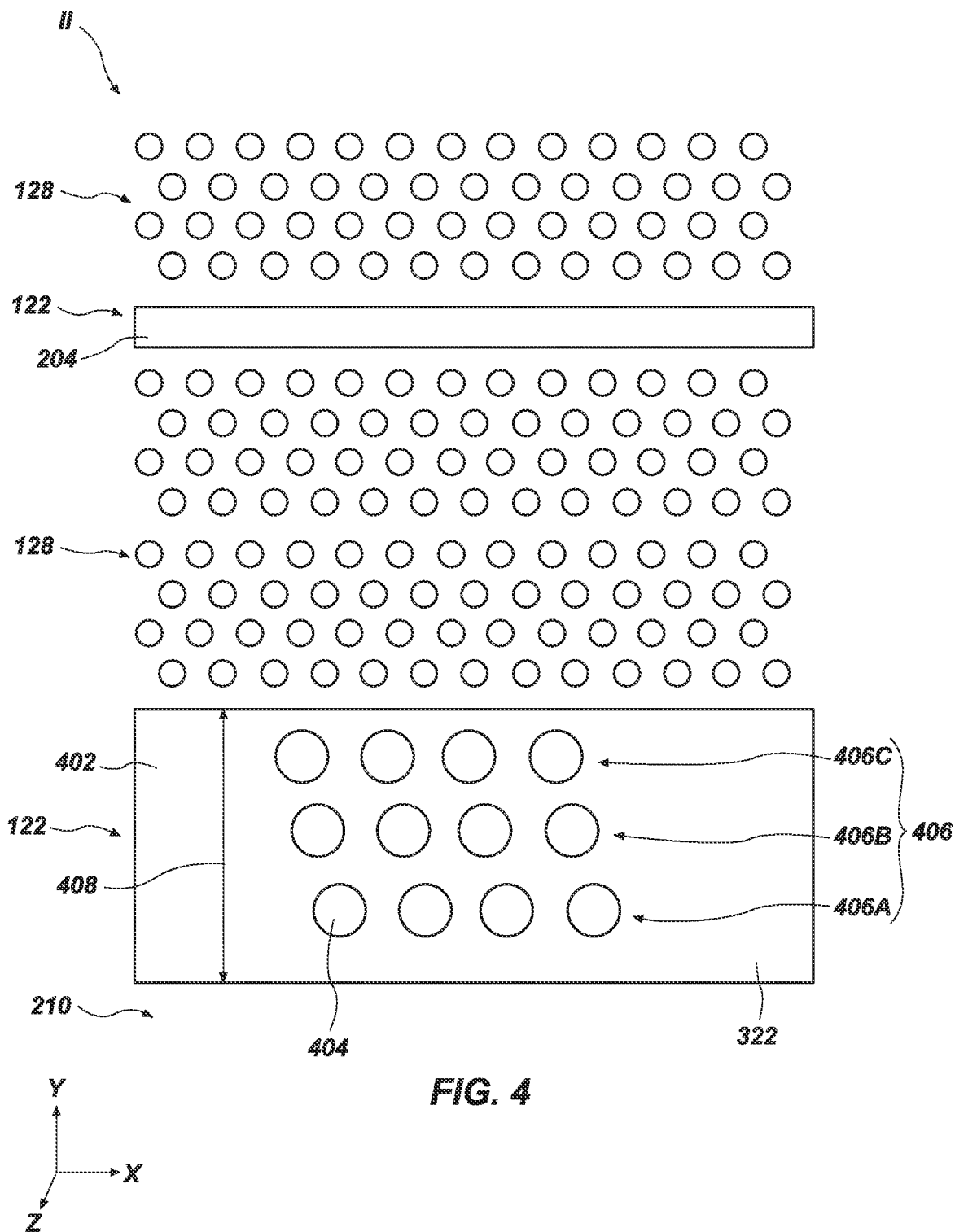
FIG. 4 illustrates an enlarged top-down view of a portion II of the embodiment of the microelectronic device structure illustrated in FIG. 2.

Referring back to FIG. 2, as described above, the microelectronic device structure 200 may include an exit block 208 having a different configuration from at least some other of the blocks 120 of the microelectronic device structure 200. The array region 128 of the exit block 208 may be configured to serve as a bit line exit region 210, where an external connection may be made to bit lines extending between the cell pillar structures 132 of horizontally neighboring (e.g., in the Y-direction) arrays 130 of the cell pillar structures 132. FIG. 4 illustrates an enlarged top-down view of the portion II of the microelectronic device structure 200 shown in FIG. 2, including the slot structure 122 neighboring a bit line exit region 210 of the exit block 208.

The slot structure 122 between the bit line exit region 210 and a neighboring array region 128 may be a wide slot structure 402. Similar to the wide regions 206 described above, the wide slot structure 402 may have a width sufficient to support multiple contact structures, such as deep contact structures 404 (e.g., digit line contact structures). For example, the wide slot structure 402 may have a width in the Y-direction greater than or equal to about 500 nm, such as within a range of from about 500 nm to about 3 µm, or from about 1 µm to about 2.5 µm.

The wide slot structure 402 may include multiple deep contact structures 404 within a horizontal area thereof. The deep contact structures 404 may individually vertically extend through insulative fill 322 of the wide slot structure 402 to or into the base construction 320 (FIG. 3C). The insulative fill 322 of the wide slot structure 402 may substantially horizontally surround deep contact structures 404.

As illustrated in FIG. 4, the deep contact structures 404 may be arranged in rows 406 extending in parallel with one another in the X-direction, such as a first row 406A, a second row 406B, and a third row 406C. In some embodiments, the rows 406 may be laterally offset from one another as illustrated in FIG. 1, such that the deep contact structures 404 of one of the rows 406 (e.g., the first row 406A) are not laterally aligned with the deep contact structures 404 of another one of the rows 406 (e.g., the second row 406B) in the X-direction. In other embodiments, at least some of the deep contact structures 404 of at least one of the rows 406 (e.g., the first row 406A) are laterally aligned, in the X-direction, with at least some of the deep contact structures 404 of at least one other of the rows 406 (e.g., the second row 406B).

Figure 5:
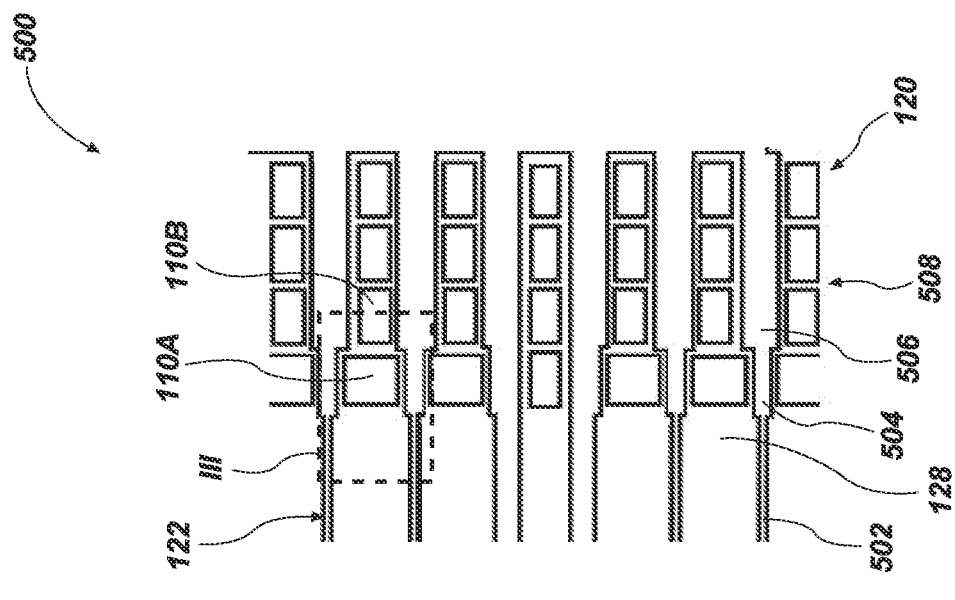
FIG. 5 illustrates a top-down view of a microelectronic device structure in accordance with an embodiment of the disclosure.

FIG. 5 illustrates a top-down view of a microelectronic device structure 500, in accordance with additional embodiments of the disclosure. The configuration of the microelectronic device structure 500 described hereinbelow may be employed in the microelectronic device structure 100 previously described with reference to FIG. 1. Accordingly, some reference numerals previously described with reference to FIG. 1 are also presented in FIG. 5, and are associated with features (e.g., regions, materials, structures, devices) substantially the same as those previously described with reference to FIG. 1. It will also be understood that, even if not identified by a reference numeral in FIG. 5, the microelectronic device structure 500 may include any (e.g., all) of the additional features of the microelectronic device structure 100 previously described with reference to FIG. 1.

Similar to the microelectronic device structure 200 (FIG. 2) previously described herein, the microelectronic device structure 500 may include a stack structure (e.g., corresponding to the stack structure 102 (FIG. 1)) including different blocks 120 including array regions 128 and staircase regions 508, slot structures 122 horizontally interposed in the Y-direction between blocks 120 horizontally neighboring one another in the Y-direction. The array regions 128 may be substantially the same as previously described herein in relation to the microelectronic device structure 100 (FIG. 1) and the microelectronic device structure 200 (FIG. 2) and may include the arrays 130 (FIG. 1) of cell pillar structures 132 (FIG. 1). Each staircase region 508 of an individual block 120 of the microelectronic device structure 500 may include multiple horizontally aligned stadium structures 110. The slot structures 122 of the microelectronic device structure 500 may individually include narrow slot regions 502, intermediate slot regions 504, and wide slot regions 506. The narrow slot regions 502 may horizontally overlap the array regions 128 in the X-direction. The intermediate slot regions 504 may horizontally overlap, in the X-direction, the first stadium structures 110A of the staircase regions 508. The wide slot regions 506 may horizontally overlap, in the X-direction, the remaining stadium structures 110 (e.g., the stadium structures 110 other than the first stadium structures 110A) of the staircase regions 508. As described above, at least a portion of the first stadium structure 110A may have a different contact configuration than the remaining stadium structures (e.g., the stadium structures 110B-110D previously described with reference to FIG. 1) due to the inclusion of a select gate region within the first stadium structure 110A.

Figure 6:
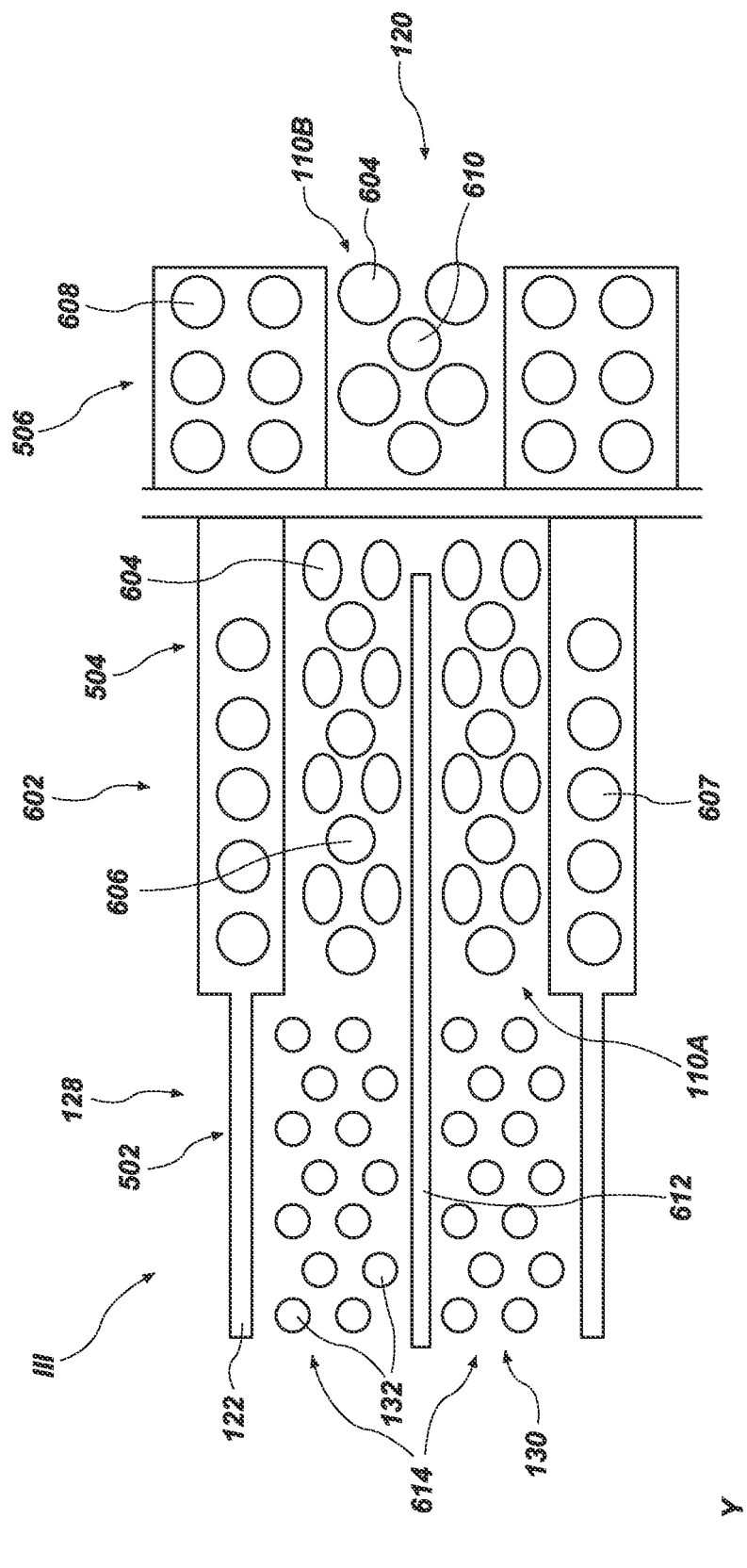
FIG. 6 illustrates an enlarged top-down view of a portion III of the embodiment of the microelectronic device structure illustrated in FIG. 5.

FIG. 6 illustrates an enlarged top-down view of a portion of the microelectronic device structure 500 within a section III shown in FIG. 5. The section III includes a portion of the array region 128, a portion of the first stadium structure 110A, and a portion of the second stadium structure 110B of an individual block 120. In addition, the section III includes the narrow slot regions 502, the intermediate slot regions 504, and the wide regions 506 of slot structures 122 horizontally neighboring (e.g., in the X-direction) the block 120. The stadium structures 110 within the staircase region 508 (FIG. 5) may individually have a width in the Y-direction that is less than a width in the Y-direction of the array region 128. The relatively smaller width of the stadium structures 110 within the stadium structures 110 may provide the slot structures 122 with relatively greater widths in the intermediate slot regions 504 and the wide slot regions 506. The first stadium structure 110A may have a width in the Y-direction that is greater than a width of the second stadium structure 110B in the Y-direction.

As described above, different tiers 108 within each block 120 may have different purposes. For example, conductive structures 106 (FIG. 1) relatively vertically higher tiers 108 (FIG. 1) (e.g., upper tiers), such as those within vertical boundaries of the first stadium structure 110A, may serve as upper select gate structures (e.g., drain side select gate (SGD) structures) 614 for upper select transistors (e.g., drain side select transistors) for individual the blocks 120. For an individual block 120, each select gate structure 614 thereof (as defined by the conductive structures 106 (FIG. 1) of vertically higher tiers 108 and filled slots 612) may include one or more select gate contact structures 606 in electrical communication therewith. The select gate contact structures 606 may horizontally overlap and contact a select gate structure 614 associated therewith at a top portion of the first stadium structure 110A. The microelectronic device structure 200 (FIG. 2) also includes first active contact structures 607 formed within the intermediate slot region 504 adjacent to the first stadium structure 110A and extending to the base construction 320 (FIG. 3). The first active contact structures 607 formed in the intermediate slot region 504 may be substantially surrounded by the insulative fill material of the slot structure 122, such that the first active contact structures 607 within the intermediate slot region 504 may extend past multiple conductive structures 106 (FIG. 1) without horizontally overlapping the conductive structures 106 (FIG. 1). Support contact structures 604 including insulative material may also be formed in the first stadium structure 110A between the select gate structures 614.

Conductive structures 106 of relatively lower tiers 108, such as the tiers 108 having horizontal ends at least partially defining the staircase structures 112 stadium structures 110 vertically underlying the first stadium structure 110A (e.g., the second stadium structure 110B, third stadium structure 110C, and fourth stadium structure 110D), as well as tiers 108 at least partially defining relatively lower steps 116 within the first stadium structure 110A may be employed as access line structures, and are not partitioned by the filled slots 612. This may result in fewer support contact structures 604 in the staircase structures 112 of the stadium structures 110 vertically underlying the first stadium structure 110A, as well as the tiers 108 at least partially defining relatively lower steps 116 within the first stadium structure 110A. Additional contact structures 610 (e.g., access line contact structures) may contact the conductive structures 106 of such relatively lower tiers 108 at the steps 116 of the relatively vertically lower stadium structures 110 of an individual block 120. In addition, within the horizontal areas of the relatively vertically lower stadium structures 110, support contact structures 604 may vertically extend through the tiers 108 to a base construction, such as the base construction 320 (FIG. 3B) underlying the blocks 120. The support contact structures 604 may be configured to support the tiers 108 during the replace gate process described above. Second active contact structures 608 may be positioned within the wide slot regions 506 adjacent to the associated stadium structures 110. The second active contact structures 608 may extend to the base construction 320 (FIG. 3B). The insulative fill material in the wide slot region 506 may substantially isolate the second active contact structures 608 from the adjacent conductive structures 106 to substantially prevent shorts from forming between the conductive structures 106 (FIG. 1) of different tiers 108 (FIG. 1) by way of the second active contact structures 608.

Figure 7:
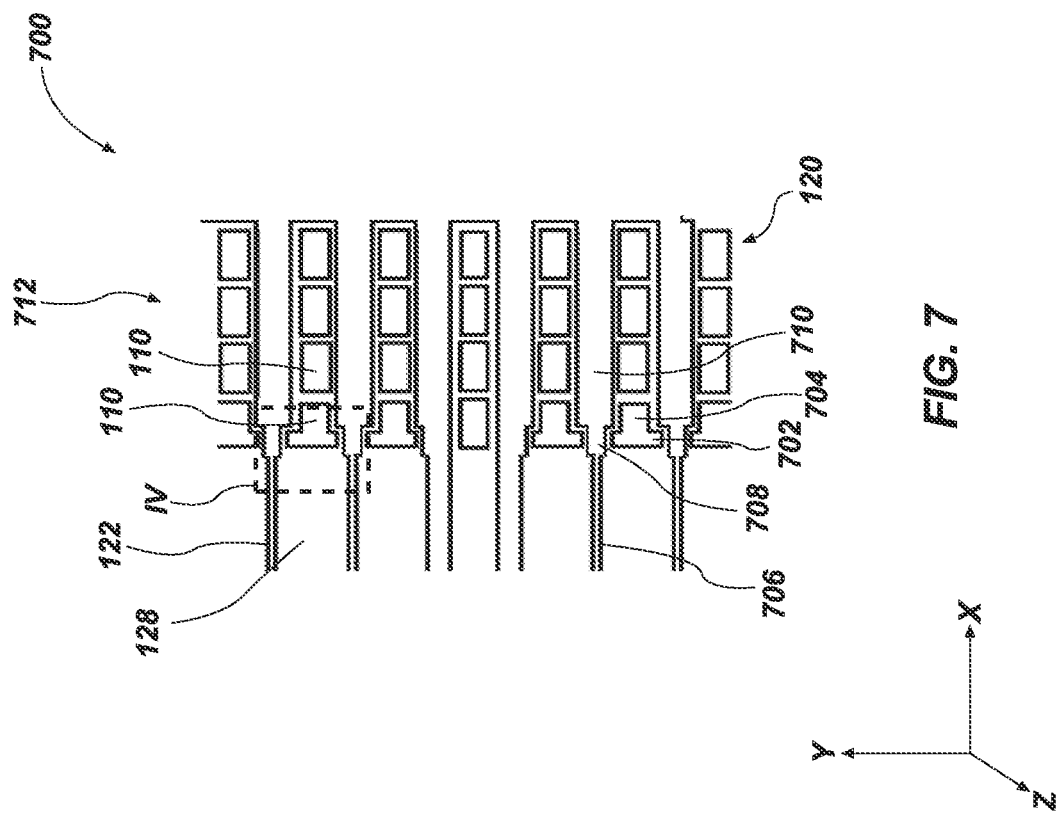
FIG. 7 illustrates a top-down view of a microelectronic device structure, in accordance with an embodiment of the disclosure.

FIG. 7 illustrates a top-down view of another embodiment of a microelectronic device structure 700. The configuration of the microelectronic device structure 700 described hereinbelow may be employed in the microelectronic device structure 100 previously described with reference to FIG. 1. Accordingly, some reference numerals previously described with reference to FIG. 1 are also presented in FIG. 7, and are associated with features (e.g., regions, materials, structures, devices) substantially the same as those previously described with reference to FIG. 1. It will also be understood that, even if not identified by a reference numeral in FIG. 7, the microelectronic device structure 700 may include any (e.g., all) of the additional features of the microelectronic device structure 100 previously described with reference to FIG. 1.

Similar to the microelectronic device structures 200 (FIG. 2) and 500 (FIG. 5) described herein, the microelectronic device structure 700 may include a stack structure (e.g., corresponding to the stack structure 102 (FIG. 1)) including different blocks 120 including array regions 128 and staircase regions 712, slot structures 122 horizontally interposed in the Y-direction between blocks 120 horizontally neighboring one another in the Y-direction. The array regions 128 may be substantially the same as previously described herein in relation to the microelectronic device structure 100 (FIG. 1) and the microelectronic device structure 200 (FIG. 2) and may include the arrays 130 (FIG. 1) of cell pillar structures 132 (FIG. 1). Each staircase region 712 of an individual block 120 of the microelectronic device structure 700 may include multiple horizontally aligned stadium structures 110. At least a portion of the first stadium structure 110A may have a different contact configuration than the remaining stadium structures 110 (e.g., the stadium structures 110B-110D previously described with reference to FIG. 1), at least due to the inclusion of a select gate region 702 in the first stadium structure 110A. The first stadium structure 110A may include at least two distinct regions. The at least two distinct regions may include a select gate region 702 and a staircase contact region 704.

The blocks 120 are separated by slot structures 122. The slot structures 122 may individually include narrow slot regions 706, intermediate slot regions 708, and wide slot regions 710. The narrow slot regions 706 may horizontally overlap the array regions 128 in the X-direction, the intermediate slot regions 708 may horizontally overlap, in the X-direction, the select gate region 702 of the first stadium structure 110A in each staircase region 712, and the wide slot regions 710 may horizontally overlap, in the X-direction, the remaining stadium structures 110 (e.g., the stadium structures 110B-110D previously described with reference to FIG. 1) in each staircase region 712 and the staircase contact region 704 of the first stadium structure 110A. The stadium structures 110 within the staircase region 712 may individually have a width in the Y-direction that is less than a width in the Y-direction of the array region 128. The relatively smaller width of the stadium structures 110 within the stadium structures 110 may provide the slot structures 122 with relatively greater widths in the intermediate slot regions 708 and the wide slot regions 710. The first stadium structure 110A may have two different widths in the Y-direction. For example, the select gate region 702 may have a width, in the Y-direction, greater than a width, in the Y-direction, of the staircase contact region 704.

Figure 8:
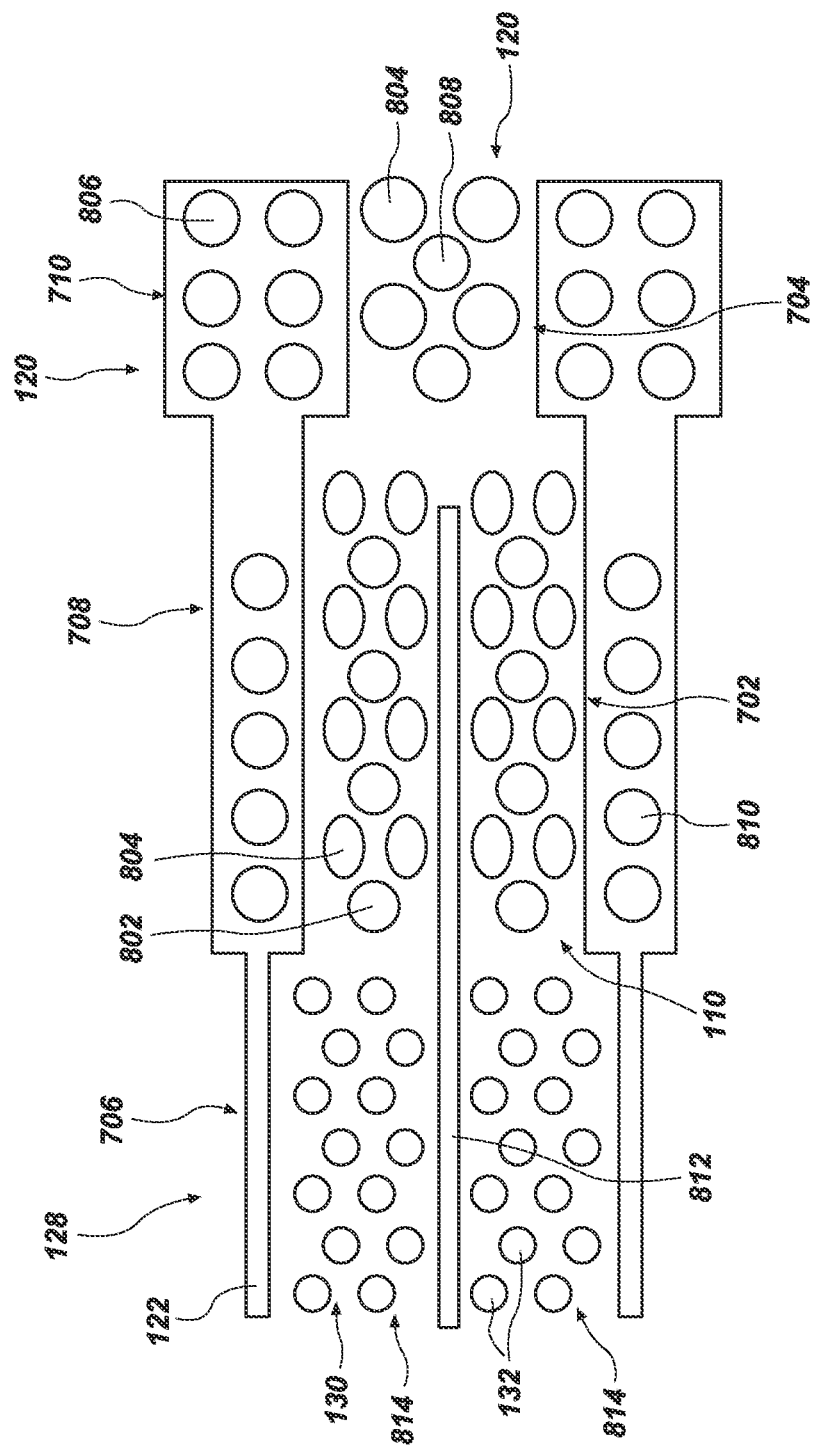
FIG. 8 illustrates an enlarged top-down view of a portion IV of the embodiment of the microelectronic device structure illustrated in FIG. 7.

FIG. 8 illustrates an enlarged top-down view of a portion of the microelectronic device structure 700 within a section IV shown in FIG. 7. The section IV includes a portion of the array region 128 and a portion of the first stadium structure 110A of an individual block 120. In addition, the section IV includes the narrow slot regions 706, the intermediate slot regions 708, and the wide slot regions 710 of slot structures 122 horizontally neighboring (e.g., in the Y-direction) the block 120.

As described above, different tiers 108 (FIG. 1) within each block 120 may have different purposes. For example, conductive structures 106 (FIG. 1) in relatively vertically higher tiers 108 (FIG. 1) (e.g., upper tiers), such as those within vertical boundaries of the first stadium structure 110A, may be serve as upper select gate structures (e.g., drain side select gate (SGD) structures) 814 for upper select transistors (e.g., drain side select transistors) for individual blocks 120. For an individual block 120, each select gate structure 814 thereof (as defined by the conductive structures 106 (FIG. 1) of vertically higher tiers 108 and filled slots 812) may include one or more select gate contact structures 802 in electrical communication therewith. The select gate contact structures 802 may horizontally overlap and contact a select gate structure 814 associated therewith at the select gate region 702 of the adjacent first stadium structure 110A. The microelectronic device structure 200 (FIG. 2) may also include first active contact structures 810 positioned within the intermediate slot region 708 adjacent to the select gate region 702 of the first stadium structure 110A and extending to the base construction 320 (FIG. 3B). The first active contact structures 810 formed in the intermediate slot region 708 may be substantially surrounded by the insulative fill material of the slot structure 122, such that the first active contact structures 810 within the intermediate slot region 708 may extend past multiple conductive structures 106 (FIG. 1) without horizontally overlapping the conductive structures 106 (FIG. 1). Support contact structures 804 including insulative material may also be formed in the first stadium structure 110A between the select gate structures 814.

Conductive structures 106 of relatively lower tiers 108, such as the tiers 108 having horizontal ends at least partially defining the staircase structures 112 of the stadium structures 110 vertically underlying the first stadium structure 110A and the tiers 108 at least partially defining relatively lower steps 116 within the staircase contact region 704 of the first stadium structure 110A may be employed as access line structures, and are not partitioned by the filled slots 812. This may result in fewer support contact structures 604 in the tiers 108 at least partially defining relatively lower steps 116 within the staircase contact region 704 of the first stadium structure 110A, as well as the staircase structures 112 of the stadium structures 110 vertically underlying the first stadium structure 110A (e.g., the stadium structures 110B-110D). Additional contact structures 808 (e.g., access line contact structures) may contact the conductive structures 106 of the relatively lower tiers 108 at the steps 116 of the relatively vertically lower stadium structures 110 of an individual block 120. In addition, within the horizontal areas of the relatively vertically lower stadium structures 110, support contact structures 804 may vertically extend through the tiers 108 to a base construction, such as the base construction 320 (FIG. 3B) underlying the blocks 120. The support contact structures 804 may be configured to support the tiers 108 during the replace gate process described above. Second active contact structures 806 may be positioned within the wide slot regions 710 adjacent to the associated stadium structures 110 and/or the staircase contact region 704 of the first stadium structure 110A. The second active contact structures 806 may extend to the base construction. The insulative fill in the wide slot region 710 may substantially isolate the second active contact structures 806 from the adjacent conductive structures 106, such that the insulative fill may substantially prevent shorts from forming between the conductive structures 106 (FIG. 1) of different tiers 108 (FIG. 1) by way of the second active contact structures 806.

Figure 9:
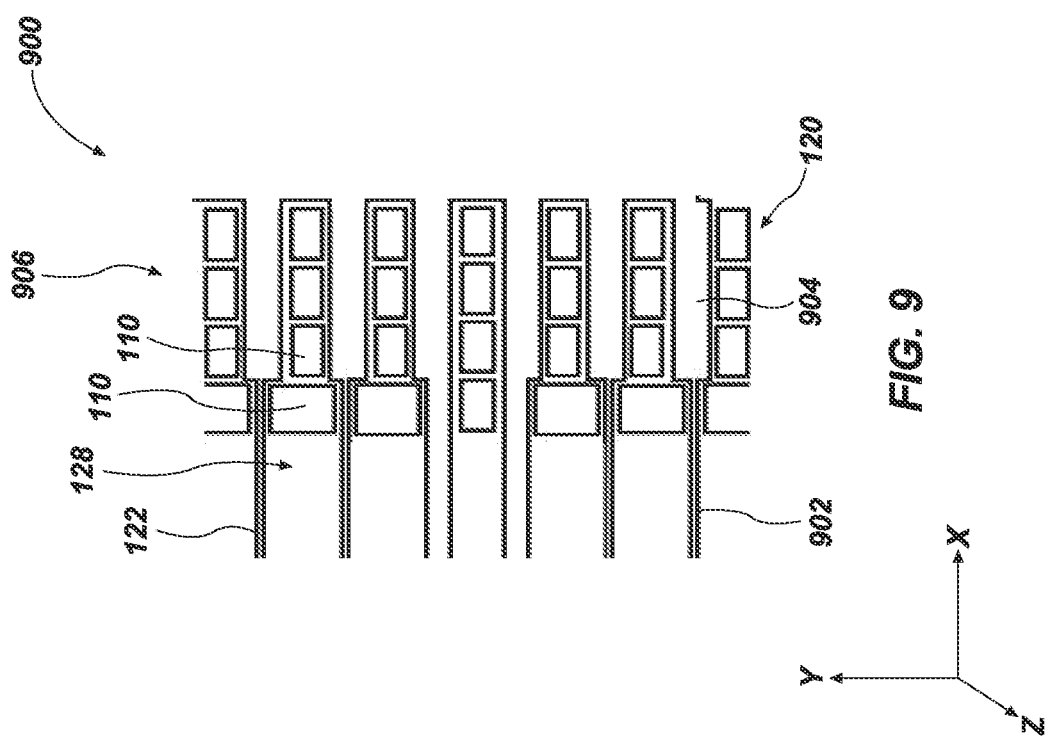
FIG. 9 illustrates a top-down view of a microelectronic device structure, in accordance with an embodiment of the disclosure.

FIG. 9 illustrates a top-down view of another embodiment of a microelectronic device structure 900. The configuration of the microelectronic device structure 900 described hereinbelow may be employed in the microelectronic device structure 100 previously described with reference to FIG. 1. Accordingly, some reference numerals previously described with reference to FIG. 1 are also presented in FIG. 9, and are associated with features (e.g., regions, materials, structures, devices) substantially the same as those previously described with reference to FIG. 1. It will also be understood that, even if not identified by a reference numeral in FIG. 9, the microelectronic device structure 900 may include any (e.g., all) of the additional features of the microelectronic device structure 100 previously described with reference to FIG. 1.

Similar to the microelectronic device structures 200 (FIG. 2), 500 (FIG. 5), and 700 (FIG. 7) described herein, the microelectronic device structure 900 may include a stack structure (e.g., corresponding to the stack structure 102 (FIG. 1)) including different blocks 120 including array regions 128, staircase regions 906, slot structures 122 horizontally in the Y-direction between blocks 120 horizontally neighboring one another in the Y-direction. The array regions 128 may be substantially the same as previously described herein in relation to the microelectronic device structure 100 (FIG. 1) and the microelectronic device structure 200 (FIG. 2) and may include the arrays 130 (FIG. 1) of cell pillar structures 132 (FIG. 1). The staircase regions 906 of the microelectronic device structure 900 may individually include multiple horizontally aligned stadium structures 110. At least a portion of the first stadium structure 110A may have a different contact configuration than the remaining stadium structures 110 (e.g., the stadium structures 110B-110D previously described with reference to FIG. 1), at least due to the inclusion of a select gate region in the first stadium structure 110A.

The blocks 120 are separated by slot structures 122. The slot structures 122 may individually include narrow slot regions 902 and wide slot regions 904. The narrow slot regions 902 may horizontally overlap the array regions 128 in the X-direction. The narrow slot region 902 may also horizontally overlap, in the X-direction, the first stadium structure 110A in each staircase region 906. The wide slot regions 904 may horizontally overlap, in the X-direction, the remaining stadium structures 110 (e.g., stadium structures 110B-110D previously described with reference to FIG. 1) in each staircase region 906. In some embodiments, as illustrated in FIG. 9, the narrow slot region 902 may horizontally overlap, in the X-direction, the entire first stadium structure 110A before transitioning to the wide slot region 904. In other embodiments, the narrow slot region 902 may horizontally overlap, in the X-direction, a portion of the first stadium structure 110A including the select gate region and transition to the wide slot region 904 part way through the first stadium structure 110A, similar to the transition from the intermediate slot region 708 to the wide slot region 710 in the microelectronic device structure 700 described with respect to FIGS. 7 and 8.

The first stadium structure 110A may have a width, in the Y-direction, that is substantially the same as a width, in the Y-direction, of the array region 128. The remaining stadium structures 110 (e.g., stadium structures 110B-110D) in the staircase region 906 may have a width, in the Y-direction, that is less than the width of an array region 128. The relatively smaller width of the stadium structures 110 may provide the slot structures 122 with relatively greater widths in the wide slot regions 904. Thus, the first stadium structure 110A may have a width, in the Y-direction, that is greater than the width, in the Y-direction, of the remaining stadium structures 110 (e.g., stadium structures 110B-110D).

Similar to the embodiments described above, the wide slot regions 904 horizontally overlapping, in the X-direction, the remaining stadium structures 110 may include active contact structures (e.g., second active contact structures 302 (FIG. 3A), second active contact structures 608 (FIG. 6), second active contact structures 806 (FIG. 8)) positioned within the wide slot regions 904 adjacent to the associated stadium structures 110. The active contact structures may extend to the base construction 320 (FIG. 3A). The insulative fill material in the wide slot region 904 may substantially isolate the active contact structures from the adjacent conductive structures 106 (FIG. 1), such that the insulative fill may substantially prevent shorts from forming between conductive structures 106 (FIG. 1) of different tiers 108 (FIG. 1) by way of the active contact structures.

Thus, in accordance with embodiments of the disclosure, a microelectronic device includes a stack structure including tiers each including insulative material and conductive material vertically adjacent the insulative material. The stack structure is divided into at least two blocks separated from one another. The microelectronic device further includes at least one slot structure horizontally interposed between the at least two blocks of the stack structure, the at least one slot structure including additional insulative material and at least one contact structure extending through the additional insulative material to source tier underlying the stack structure.

Figure 10:
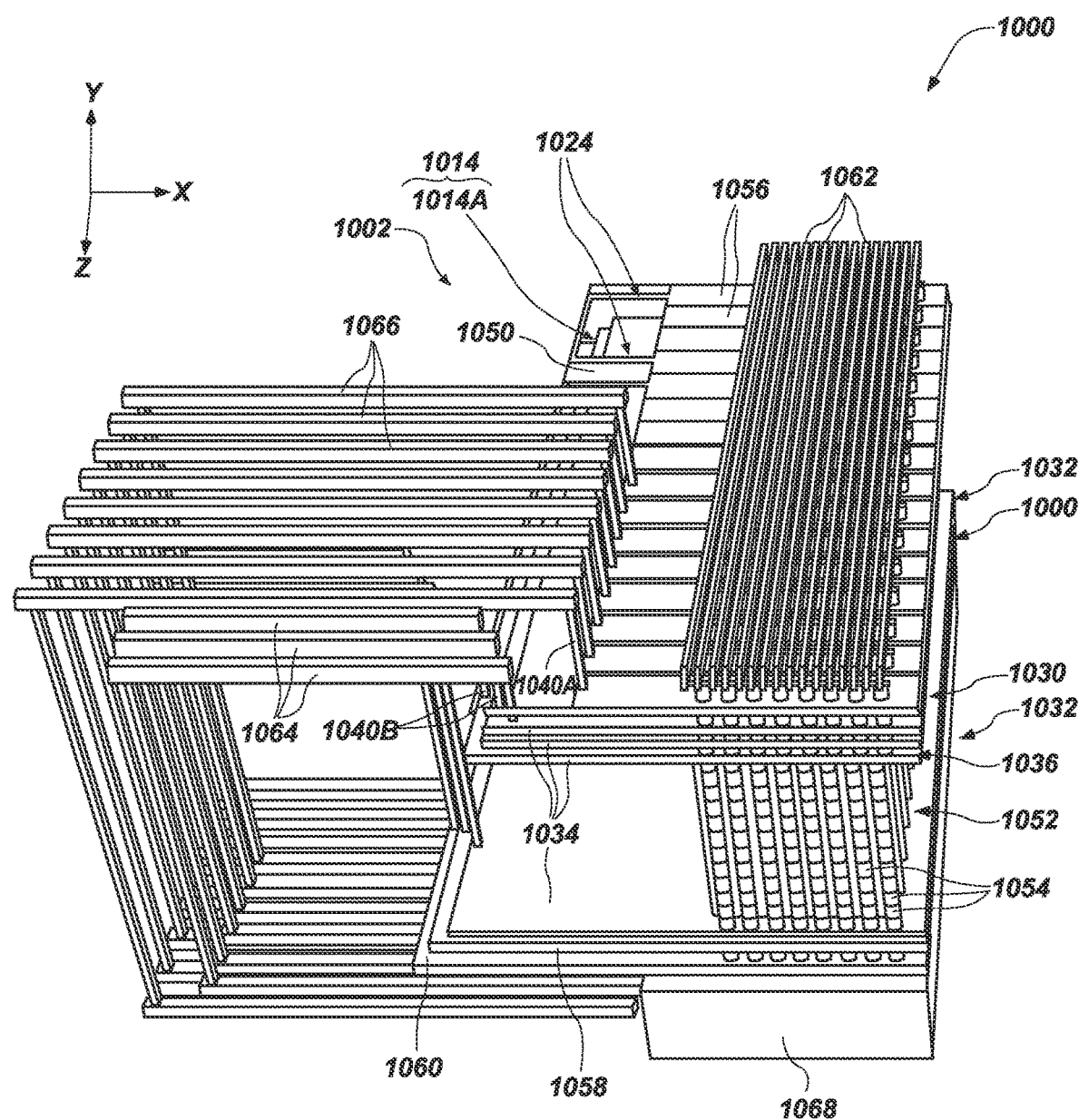
FIG. 10 is a simplified partial cutaway perspective view of a microelectronic device, in accordance with embodiments of the disclosure.

Microelectronic device structures (e.g., the microelectronic device structures 100, 200, 500, 700, and 900 previously described with reference to FIGS. 1-9) of the disclosure may be included in microelectronic devices of the disclosure. For example, FIG. 10 illustrates a partial cut-away perspective view of a portion of a microelectronic device 1002 (e.g., a memory device, such as a 3D NAND Flash memory device) including a microelectronic device structure 1000. The microelectronic device structure 1000 may be substantially similar to one of the microelectronic device structures 100, 200, 500, 700, and 900, previously described with reference to FIGS. 1-9. For clarity and ease of understanding the drawings and associated description, some features (e.g., structures, materials) of the microelectronic device structures 100, 200, 500, 700, and 900, previously described herein are not shown in FIG. 10. However, it will be understood that any features of the microelectronic device structures 100, 200, 500, 700, and 900, previously described with reference to one or more of FIGS. 1-9 may be included in the microelectronic device structure 1000 of the microelectronic device 1002 described herein with reference to FIG. 10.

As shown in FIG. 10, the microelectronic device structure 1000 previously described herein in relation to one or more of the microelectronic device structures 100, 200, 500, 700, and 900 (FIGS. 1-9), the microelectronic device 1002 may include cell pillar structures 1052, such as the cell pillar structures 132, vertically extending through at least some blocks 1030 of the stack structure 1032. As described above, the cell pillar structures 1052 may be positioned within array regions 128 (e.g., memory array regions) of the blocks 1030 horizontally offset (e.g., in the X-direction) from the stadium structures 1014 (e.g., the first stadium structure 1014A) (and, hence, the bridge regions 1024 and the further filled slot structures 1050) within the blocks 1030. Intersections of the cell pillar structures 1052 and the conductive material 1034 of the tiers 1036 of the stack structure 1032 within the horizontal areas of the blocks 1030 form strings of memory cells 1054 vertically extending through each block 1030 of the stack structure 102. For each string of memory cells 1054, the memory cells 1054 thereof may be coupled in series with one another. Within each block 1030, the conductive material 1034 of some of the tiers 1036 of the stack structure 1032 may serve as access line structures (e.g., word line structures) for the strings of memory cells 1054 within the horizontal area of the block 1030. In some embodiments, within each block 1030, the memory cells 1054 formed at the intersections of the conductive material 1034 of some of the tiers 1036 and the cell pillar structures 1052 comprise so-called "MONOS" (metal-oxide-nitride-oxide-semiconductor) memory cells. In additional embodiments, the memory cells 1054 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 1054 comprise so-called "floating gate" memory cells including floating gates (e.g., metallic floating gates) as charge storage structures. The floating gates may horizontally intervene between central structures of the cell pillar structures 1052 and the conductive material 1034 of the different tiers 1036 of the stack structure 1032.

The microelectronic device 1002 may further include at least one source structure 1060, access line routing structures 1064, first select gates 1056 (e.g., upper select gates, drain select gates (SGDs)), select line routing structures 1066, one or more second select gates 1058 (e.g., lower select gates, source select gate (SGSs)), and digit line structures 1062. The digit line structures 1062 may vertically overlie and be coupled to the cell pillar structures 1052 (and, hence, the strings of memory cells 1054). The source structure 1060 may vertically underlie and be coupled to the cell pillar structures 1052 (and, hence, the strings of memory cells 1054). In addition, the first contact structures 1040A (e.g., select line contact structures) and the second contact structures 1040B (e.g., access line contact structures) may couple various features of the microelectronic device 1002 to one another as shown (e.g., the select line routing structures 1066 to the first select gates 1056; the access line routing structures 1064 to the conductive materials 1034 of the tiers 1036 of the stack structure 1032 underlying the first select gates 1056 and defining access line structures of the microelectronic device 1002).

The microelectronic device 1002 may also include a base structure 1068 (e.g., corresponding to the base construction 320 (FIG. 3C)) positioned vertically below the cell pillar structures 1052 (and, hence, the strings of memory cells 1054). The base structure 1068 may include at least one control logic region including control logic devices configured to control various operations of other features (e.g., the strings of memory cells 1054) of the microelectronic device 1002. As a non-limiting example, the control logic region of the base structure 1068 may further include one or more (e.g., each) of charge pumps (e.g., VCCP charge pumps, VNEGWL charge pumps, DVC2 charge pumps), delay-locked loop (DLL) circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 1068 may be coupled to the source structure 1060, the access line routing structures 1064, the select line routing structures 1066, and the digit line structures 1062. In some embodiments, the control logic region of the base structure 1068 includes CMOS (complementary metal-oxide-semiconductor) circuitry. In such embodiments, the control logic region of the base structure 1068 may be characterized as having a "CMOS under Array" ("CuA") configuration.

Thus, in accordance with embodiments of the disclosure, a memory device, includes a stack structure including a vertically alternating sequence of conductive material and insulative material arranged in tiers, the stack structure divided in blocks horizontally extending in parallel in a first direction. Each block includes an array region including cell pillar structures defining vertically extending strings of memory cells. Each block further includes a staircase region horizontally offset from the array region in the first direction and including one or more stadium structures. The memory device further includes slot structures horizontally interposed between the blocks of the stack structure in a second direction orthogonal to the first direction. The slot structures individually include a first region horizontally overlapping the array region of one of the blocks in the first direction. The slot structures further individually include a second region horizontally overlapping the staircase region of the one of the blocks in the first direction, the second region having a relatively larger width in the second direction than the first region.

Further embodiments of the disclosure include a method of forming a memory device. The method including forming a stack structure including tiers each comprising insulative material and conductive material vertically adjacent the insulation material. The method further includes forming slots vertically extending completely through the stack structure, the slots dividing the stack structure into multiple blocks spaced apart from one another in a first direction. The method also includes filling the slots with insulative fill material to form slot structures. The method further includes forming cell pillar structures vertically extending through the blocks of the stack structure. The method also includes forming stadium structures in the blocks of the stack structure, the stadium structures offset from the cell pillar structures in a second direction orthogonal to the first direction and individually having steps comprising horizontal ends of some of the tiers of the stack structure. The method also includes forming conductive contact structures within horizontal areas of the slot structures, the conductive contact structures vertically extending through the insulative fill material.

Figure 11:
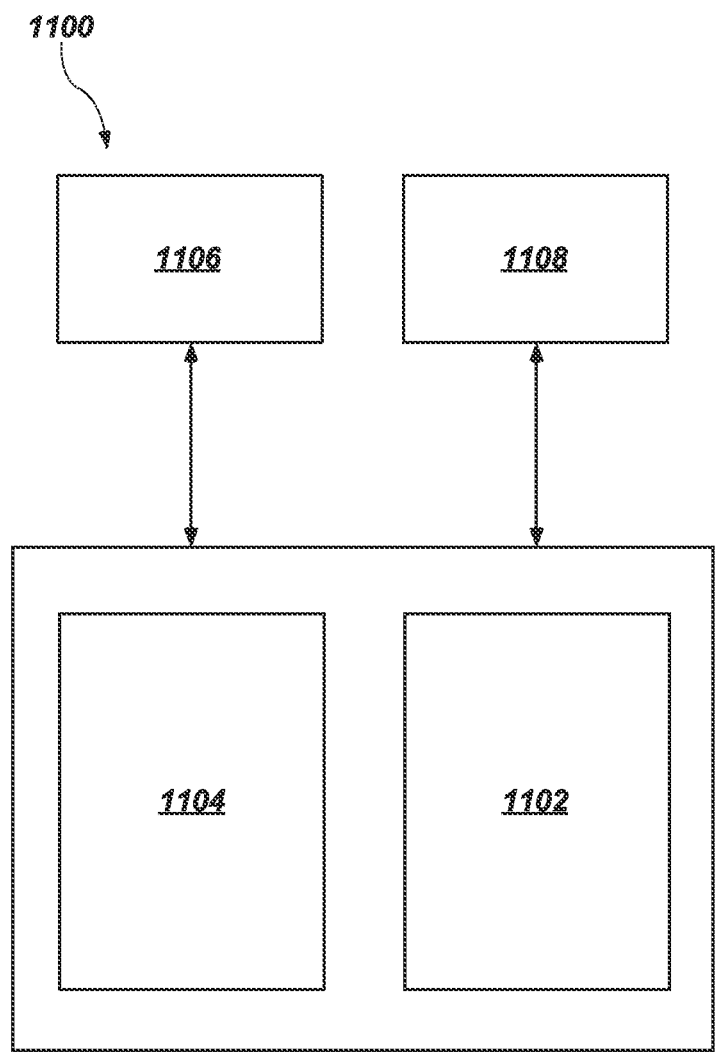
FIG. 11 is a schematic block diagram of an electronic system, in accordance embodiments of the disclosure.

Microelectronic devices (e.g., the microelectronic device 1002) and microelectronic device structures (e.g., the microelectronic device structure 100, 200, 500, 700, and 900) of the disclosure may be included in embodiments of electronic systems of the disclosure. For example, FIG. 11 is a block diagram of an electronic system 1100, in accordance with embodiments of the disclosure. The electronic system 1100 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 1100 includes at least one memory device 1102. The memory device 1102 may include, for example, an embodiment of one or more of a microelectronic device (e.g., the microelectronic device 1002 previously described with reference to FIG. 10) and a microelectronic device structure (e.g., the microelectronic device structure 100, 200, 500, 700, or 900, previously described with reference to FIGS. 1-9) previously described herein.

The electronic system 1100 may further include at least one electronic signal processor device 1104 (often referred to as a "microprocessor"). The electronic signal processor device 1104 may, optionally, include an embodiment of one or more of a microelectronic device (e.g., the microelectronic device 1002 previously described with reference to FIG. 10) and a microelectronic device structure (e.g., the microelectronic device structure 100, 200, 500, 700, or 900, previously described with reference to FIGS. 1-9) previously described herein. The electronic system 1100 may further include one or more input devices 1106 for inputting information into the electronic system 1100 by a user, such as, for example, a mouse or other pointing device, a keyboard, a touchpad, a button, or a control panel. The electronic system 1100 may further include one or more output devices 1108 for outputting information (e.g., visual or audio output) to a user such as, for example, a monitor, a display, a printer, an audio output jack, a speaker, etc. In some embodiments, the input device 1106 and the output device 1108 may comprise a single touchscreen device that can be used both to input information to the electronic system 1100 and to output visual information to a user. The input device 1106 and the output device 1108 may communicate electrically with one or more of the memory device 1102 and the electronic signal processor device 1104.

Thus, embodiments of the disclosure include an electronic system. The electronic system includes an input device, an output device, a processor device operably coupled to the input device and the output device, and a memory device operably coupled to the processor device. The memory device includes at least one microelectronic device structure. The microelectronic device structure includes at least two blocks separated in a first horizontal direction by a slot structure comprising insulative material. Each block of the at least two blocks includes an array region including vertically extending strings of memory cells. The blocks further include a staircase region neighboring the array region in a second horizontal direction orthogonal to the first horizontal direction and including at least one staircase structure, at least a portion of the staircase region having a smaller width in the first horizontal direction than the array region.

Embodiments of the disclosure may include contact structures positioned within horizontal areas of slot structures between blocks of a stack structure. The contact structures may be substantially horizontally surrounded by insulative material of the slot structures. Forming the contact structures within horizontal areas of the slot structures may reduce the complexity of forming insulative liner materials between conductive material of the contact structures and conductive material of tiers of the stack structure. This may result in increased efficiency during the forming process as well as improved yield by reducing defects otherwise associated with the insulative liner material. The structures, methods, and devices of the disclosure, including the configurations of slot structures and arrangements of the contact structures therein, may also reduce feature congestion within the crest regions of the stack structures relative to conventional structures, conventional methods, and conventional devices.

The embodiments of the disclosure described above and illustrated in the accompanying drawing figures do not limit the scope of the invention, since these embodiments are merely examples of embodiments of the invention, which are defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A microelectronic device, comprising:
a stack structure comprising tiers each including an insulative material and a conductive material vertically adjacent the insulative material, the stack structure divided into at least two blocks separated from one another; and
at least one slot structure horizontally interposed between the at least two blocks of the stack structure and comprising an additional insulative material and a row of contact structures, each contact structure of the row of contact structures individually extending through the additional insulative material to a source tier underlying the stack structure.

2. The microelectronic device of claim 1, wherein at least one contact structure of the row of contact structures comprises a conductive material.

3. The microelectronic device of claim 1, wherein the additional insulative material of the slot structure is positioned between the row of contact structures and the conductive material of each of the tiers of the stack structure.

4. The microelectronic device of claim 1, further comprising stadium structures within the at least two blocks of the stack structure, each of the stadium structures including at least one staircase structure having steps defined by horizontal ends of at least some of the tiers of the stack structure.

5. The microelectronic device of claim 4, further comprising support contact structures vertically extending through the stack structure to the source tier, the support contact structures comprising a dielectric material.

6. The microelectronic device of claim 4, wherein the row of contact structures is positioned within a portion of the slot structure that horizontally overlaps the stadium structures.

7. The microelectronic device of claim 4, further comprising additional contact structures in physical contact with portions of the conductive material of the at least some of the tiers of the stack structure defining treads of the steps of the at least one staircase structure of each of the stadium structures.

8. The microelectronic device of claim 4, wherein a width in a first direction of a portion of the slot structure at a location between a pair of the stadium structures horizontally neighboring one another in the first direction is relatively larger than an additional width in the first direction of an additional portion of the slot structure offset from the location between the pair of the stadium structures in a second direction perpendicular to the first direction.

9. The microelectronic device of claim 8, wherein the width is at least 500 nanometers (nm).

10. The microelectronic device of claim 1, wherein at least one block of the at least two blocks includes a bit line exit region having conductive bit line contact structures vertically extending completely through the additional insulative material in a neighboring slot structure.

11. The microelectronic device of claim 10, wherein the at row of contact structures is positioned within a portion of the slot structure that horizontally overlaps the bit line exit region.

12. A memory device, comprising:
a stack structure comprising a vertically alternating sequence of a conductive material and an insulative material arranged in tiers, the stack structure divided in blocks horizontally extending in parallel in a first direction and each comprising:
an array region including cell pillar structures defining vertically extending strings of memory cells; and
a staircase region horizontally offset from the array region in the first direction and including one or more stadium structures; and
slot structures horizontally interposed between adjacent blocks of the stack structure in a second direction orthogonal to the first direction and individually comprising:
a first region horizontally overlapping the array region of one of the adjacent blocks in the first direction;
a second region horizontally overlapping the staircase region of the one of the adjacent blocks in the first direction, the second region having a relatively larger width in the second direction than the first region;
a first conductive contact structure positioned within a horizontal area of the second region and extending vertically through the second region in a first horizontal position; and
a second different conductive contact structure positioned within the horizontal area of the second region and extending vertically through the second region in a second different horizontal position.

13. The memory device of claim 12, wherein the one or more stadium structures of the one of the adjacent blocks includes an uppermost stadium structure having steps comprising horizontal ends of some of the tiers of the stack structure, the conductive material of each tier of the some of the tiers employed as a select gate structure.

14. The memory device of claim 13, wherein the second region of at least one of the slot structures horizontally overlaps the uppermost stadium structure in the first direction.

15. The memory device of claim 13, wherein the slot structures individually further comprise a third region having a relatively larger width in the second direction than the second region, the third region horizontally overlapping, in the first direction, additional stadium structures within the staircase region that are positioned vertically lower than the uppermost stadium structure.

16. The memory device of claim 13, further comprising:
third conductive contact structures on the steps of the uppermost stadium.

17. An electronic system, comprising:
an input device;
an output device;
a processor device operably coupled to the input device and the output device; and
a memory device operably coupled to the processor device and comprising at least one microelectronic device structure comprising:
a stack structure comprising tiers each including an insulative material and a conductive material vertically adjacent the insulative material, the stack structure divided into at least two blocks separated in a first horizontal direction by a slot structure comprising additional insulative material and at least two contact structures extending through the additional insulative material to a source tier underlying the stack structure, the additional insulative material positioned between the at least two contact structures and between the at least two blocks and the at least two contact structures, each block of the at least two blocks including:
an array region including vertically extending strings of memory cells; and
a staircase region neighboring the array region in a second horizontal direction orthogonal to the first horizontal direction and including at least one staircase structure, at least a portion of the staircase region having a smaller width in the first horizontal direction than the array region.

18. The electronic system of claim 17, further comprising conductive contacts within a horizontal area of the slot structure and vertically extending completely through the additional insulative material.

19. The electronic system of claim 18, wherein the conductive contacts horizontally overlap the staircase region in the second horizontal direction.

20. The electronic system of claim 18, wherein the conductive contacts horizontally overlap the array region in the second horizontal direction.

21. A method of forming a memory device, comprising:
forming a stack structure including tiers each comprising insulative material and conductive material vertically adjacent the insulation material;
forming slots vertically extending completely through the stack structure, the slots dividing the stack structure into multiple blocks spaced apart from one another in a first direction;
filling the slots with insulative fill material to form slot structures;
forming cell pillar structures vertically extending through the blocks of the stack structure;
forming stadium structures in the blocks of the stack structure, the stadium structures offset from the cell pillar structures in a second direction orthogonal to the first direction and individually having steps comprising horizontal ends of some of the tiers of the stack structure; and
forming conductive contact structures within horizontal areas of the slot structures,
the conductive contact structures vertically extending to a source tier underlying the stack structure through the insulative fill material, the insulative fill material separating individual conductive contact structures of the conductive contact structures.

22. The method of claim 21, wherein forming the slots comprises forming the slots to individually have variable widths in the first direction.

23. The method of claim 22, wherein forming the slots to individually have variable widths in the first direction comprises forming portions of the slots within horizontal boundaries, in the second direction, of at least some of the stadium structures to be relatively wider than additional portions of the slots.

* * * * *